(12) United States Patent
Abbey

(10) Patent No.: US 7,398,065 B1
(45) Date of Patent: Jul. 8, 2008

(54) PROGRAMMABLE SAMPLING BAND PASS FILTER

(75) Inventor: Duane Abbey, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 843 days.

(21) Appl. No.: 10/930,568

(22) Filed: Aug. 31, 2004

(51) Int. Cl.
*H04B 1/10* (2006.01)
*H04B 1/16* (2006.01)

(52) U.S. Cl. ............ 455/130; 455/307; 455/339; 455/340

(58) Field of Classification Search .......... 455/307, 455/330–340; 341/143–144, 155
See application file for complete search history.

(56) References Cited

U.S. PATENT DOCUMENTS

| | | | |
|---|---|---|---|
| 5,012,490 A * | 4/1991 | Myer ................ 375/285 |
| 5,274,375 A | 12/1993 | Thompson ............ 341/143 |
| 5,345,233 A | 9/1994 | Nagata et al. ......... 341/176 |
| 5,623,263 A | 4/1997 | Kuo et al. ............ 341/143 |
| 5,648,779 A | 7/1997 | Cabler .............. 341/143 |
| 5,654,711 A | 8/1997 | Fujimori ............ 341/143 |
| 5,682,161 A | 10/1997 | Ribner et al. ......... 341/143 |
| 5,742,246 A | 4/1998 | Kuo et al. ............ 341/143 |
| 5,757,301 A | 5/1998 | Kuo et al. ............ 341/143 |
| 6,061,008 A | 5/2000 | Abbey .............. 341/143 |
| 6,232,901 B1 | 5/2001 | Abbey .............. 341/143 |
| 7,174,147 B2 * | 2/2007 | Toncich et al. ........ 455/339 |
| 2002/0068541 A1 * | 6/2002 | Helio et al. .......... 455/340 |
| 2006/0109939 A1 * | 5/2006 | Ciccarelli et al. ...... 375/350 |

* cited by examiner

*Primary Examiner*—Simon D Nguyen
(74) *Attorney, Agent, or Firm*—Nathan O. Jensen; Kyle Eppele

(57) ABSTRACT

A variable bandwidth, sampled analog filter can be programmed to have a variety of responses. A variable bandwidth, sampled analog filter is preferably a sampled analog resonator based filter that receives a bandwidth control input and a sample clock input. The sampled analog resonator units can include clock delay circuits and reversible (loss/gain) attenuators.

9 Claims, 24 Drawing Sheets

PROGRAMMABLE SAMPLING BAND PASS FILTER

FIELD OF THE INVENTION

The present application generally relates to the field of filters. More particularly, the present application relates to sampling band pass filters.

BACKGROUND OF THE INVENTION

High performance radio frequency (RF) circuits are utilized in communication equipment, sensing equipment, and other RF circuits. Generally, such circuits often utilize band pass filters. The band pass filters can be employed as intermediate frequency (IF) filters used in RF circuits. Multi-band digital radios often utilize multi-chip module receivers and exciters that require band pass filters. Such multi-band digital radios can be utilized in joint tactical radio systems (JTRS).

According to one particular application, conventional multi-band digital intermediate frequency (IF) radio systems require two to three programmable RF translations to establish the received signal in a fixed frequency (pre analog-to-digital conversion (ADC)) with minimal in band distortion. On the receive side of the radio, the signal is often received by at least one IF analog filter with minimal in bandwidth distortion before analog-to-digital conversion (ADC). On the transmit side of the radio, the signal is often transmitted through an IF analog filter after digital-to-analog conversion (DAC).

Multi-band and multi-signal-type operation of radio systems generally require quality programmable IF filters. Quality programmable IF filters should be highly integratible into single multi-chip module receivers and exciters, should be highly linear with low noise figure, should have accurate tuning control including temperature and tolerance factors, and should have step programmable bandwidth control with a robust shape factor. Such high quality programmable IF filters are typically too expensive and require excessive size and weight. Heretofore, the size and cost of the RF and IF translations is relatively large for highly integrated multi-chip-module receivers and exciters. The size and cost is often due, at least in part, to the size and cost of the band pass filters required for IF band pass filtering.

Therefore, there is a need for a method of filtering that is programmable in bandwidth and/or frequency and is highly integratible in IC technology. Further, there is a need for a method of achieving a programmable IF filter that can reduce the number of RF translations required (preferably to one). Further, there is a need for a programmable IF filter that can reduce RF communication circuitry, sensing circuitry, or other equipment size and cost. Further still, there is a need for a programmable IF filter that can be combined with a variable data converter clock rate to reduce radio size and cost. Further, there is a need for a programmable IF sampling band pass filter that has at least one or more of the following characteristics: 1) it is highly linear with low noise figure potential, 2) it is coherently sample rate matched to the data converter, 3) it has a programmable sample clock rate that provides accurate frequency control that has symmetrical (about the center frequency) programmable bandwidth step control and has constant Q with respect to frequency, 4) it has a cascadable configuration for performance flexibility, 5) it supports harmonically sampled single translation options, 6) it has data converter performance enhancement potential, and 7) it is highly integratible into single MCM receivers and exciters. Yet further, there is a need for a programmable IF filter combined with a variable data converter clock rate for reducing the size and cost of virtually any radio architecture.

SUMMARY OF THE INVENTION

An exemplary embodiment relates to an apparatus. The apparatus can be used in a radio frequency (RF) circuit. The apparatus includes a sample clock input, a bandwidth control input, and at least one sampled signal resonator stage. The sampled signal resonator stage includes at least one sampled signal resonator unit. The sampled signal resonator unit is coupled to the sample clock input and the bandwidth control input. The sampled signal resonator unit includes at least one reversible (loss/gain) attenuator coupled to the bandwidth control input and at least one clock delay circuit coupled with the sample clock input. The sampled signal resonator stage serves to provide at least part of a programmable bandwidth filter.

Another exemplary embodiment relates to a programmable band pass filter. The band pass filter includes an array of band pass sampled signal resonators. Each sampled signal resonator receives a separate bandwidth control signal and a common sampling clock. The sampled signal resonators include reversible (loss/gain) attenuators receiving the bandwidth control signal.

Still another exemplary embodiment relates to a programmable band pass filter. The band pass filter includes means for receiving a differential signal input and providing a first stage differential output, and means for receiving the first stage differential output and providing a second stage differential output. The means for receiving the differential signal input and the means for receiving the first stage differential output include a set of sampled signal resonator units controlled by a sampling signal and a bandwidth control input.

Yet another exemplary embodiment relates to an apparatus. The apparatus includes a sample clock input, a bandwidth control input, and at least one sampled signal resonator stage. The sampled signal resonator stage comprises a set of sampled signal resonator units. The sampled signal resonator units being coupled together so that the input of one sampled signal resonator is provided to an output of another sampled signal resonator. At least one sampled signal resonator unit can be configured as a frequency band rejection sampled signal resonator, in response to the bandwidth control input. The apparatus serves to provide a programmable bandwidth filter.

BRIEF DESCRIPTION OF THE DRAWINGS

Preferred exemplary embodiments will hereinafter be described with reference to the accompanying drawings, wherein like numerals denote like elements and.

DETAILED DESCRIPTION OF THE PREFERRED EXEMPLARY EMBODIMENTS

Figure 1:
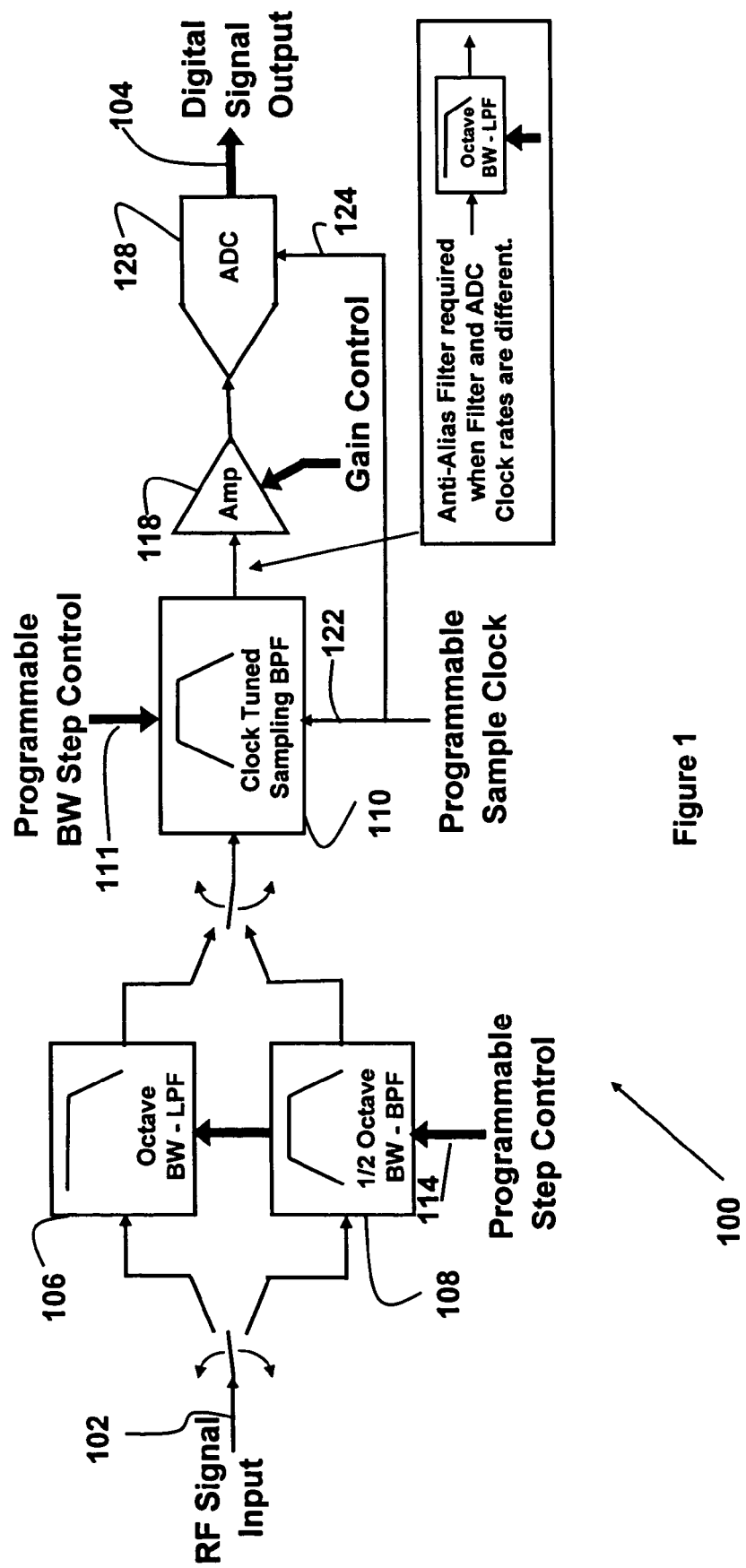
FIG. 1 is a general block diagram of a digital receiver including a programmable IF sampling band pass filter in accordance with an exemplary embodiment.

With reference to FIG. 1, a digital receiver 100 includes an RF signal input 102. RF signal input 102 preferably receives an RF signal. The RF signal center frequency is generally related to the variable sample rate clock (Fs) as being Fs/4+ n(Fs)/2, where 'n' is 0, 1, 2, 3, . . . and is generally limited to n=7 or less.

Digital receiver 100 can be utilized in a variety of applications. One preferred application is in a multi-band and/or multi-signal type radio system such as a JTRS. Alternatively, receiver 100 can be utilized in a sensor or other application requiring the reception of signals and bandwidth filtering. The present invention is not limited to any particular type of application or range of frequencies.

Receiver 100 processes the RF signal at input 102 and provides a digital signal at an output 104. Receiver 100 advantageously utilizes a programmable circuit to provide input IF filtering which is followed by conversion with an A/D converter 128. Preferably, filtering occurs before an A/D (or after a D/A stage in an exciter).

Receiver 100 includes an octave bandwidth-low pass filter 106, a half octave bandwidth filter 108, a clock tuned sampling band pass filter 110, an amplifier 118, and an analog-to-digital converter 128. The signal on RF signal input 102 can be provided on one of two paths through switches located before and after filters 106 and 108. According to a first path, the RF signal travels through filter 106 to clock tuned sampling band pass filter 110. According to a second path, the RF signal travels through filter 108 to filter 110.

Filters 106 and 108 are coupled to a programmable step control input 114 which provides a programmable step control signal (the bandwidth control signal). The programmable step control signal can be any type of signal for controlling or adjusting filters 106 and 108.

Clock tuned sampling band pass filter 110 and ADC 128 are coupled to programmable sample clock inputs, 122 and 124 respectively, which receive a sample clock signal. A programmable bandwidth control signal or step control signal is provided at programmable BW step control input 111 to filter 110.

The programmable bandwidth control signal can be any type of signal for controlling or arranging filter 110 to provide an appropriate response. In one embodiment, the bandwidth control signals are digital bits for controlling attenuators and switches within filter 110. Alternative signals can be utilized to control paths and attenuation in filter 110. The present invention is not limited to the type of bandwidth step control signals provided.

System 100 is capable of achieving significant advantages over conventional systems. System 100 is capable of operating in a multi-band and multi-signal-type of radio system. The use of filter 110 achieves high integratibility into single MCM receivers and exciters, achieves a highly linear response with low noise figures, provides accurate tuning control including temperature and tolerance factors, and provides programmable bandwidth control for robust shape factors.

System 100 is capable of operating in several IF filter modes. For example, in one mode, the programmable sample clock signal has a frequency ($F_s$), which is 4 times the carrier frequency ($F_c$) such that $F_c = \frac{1}{4} F_s$. In a second harmonic sampled signals mode, a choice of several carrier frequencies are available such that $F_c = (\frac{1}{4} + n/2)F_s$, where $n = 1, 2, 3 \ldots$. System 100 can achieve a number of advantageous response characteristics due to the operation of filter 110.

Filter 106 preferably provides anti-alias filter protection for signals where $F_c = F_s/4$. Filter 106 is preferably a low pass analog filter with shape factor SF=1.4 to protect the widest bandwidth signal over a full octave of $F_c$ where $F_s$ is the variable sampled frequency and $F_c$ is the variable signal carrier's center frequency. Preferably, filter 106 is a step tuned bandwidth in Fc octave increments. Wider maximum bandwidth signals and/or greater shaped factors can be achieved using smaller step sizes. Conversely, narrower maximum bandwidth signals and/or smaller shaped factors can allow greater step sizes. In one embodiment, $F_s$ maximum/$F_s$ minimum equals 2.0, based upon an anti-alias filter shape factor of 1.4 and a programmable bandwidth maximum at Q (quality factor) equal to 10, such that the signal maximum bandwidth is equal to $F_c/10$ or $F_s/40$. In one embodiment, filter 106 is a Butterworth or an Inverse Chebyshev type analog filter.

Filter 108 is preferably a band pass analog filter with shape factor SF=1.4 to protect the widest bandwidth signal over ½ $F_c$ octave. Filter 108 preferably has a step tuned bandwidth in ½ $F_c$ octave increments. Wider maximum bandwidth signals and/or greater shaped factor require a smaller step size. Conversely, narrower maximum bandwidth signals and/or smaller shaped factor allows for greater step sizes. Filter 108 advantageously applies to higher order signal harmonics where $F_c = (\frac{1}{4} + n/2)F_s$ and where $n = 1, 2, 3 \ldots$.

Filter 108 is preferably implemented as a Butterworth or an Inverse Chebyshev type analog filter in one embodiment. In one embodiment, $F_s$ maximum/$F_s$ minimum=1.5 based upon an anti-alias filter shape factor=1.4 and a programmable bandwidth maximum at Q (quality factor) equal to 10, such that the signal maximum bandwidth is equal to $F_c/10$ or $F_s/40$. Filters 106 and 108 advantageously serve to protect filter 110 so it is not corrupted by aliased signals.

Amplifier 118 preferably has a gain control to control the set point of the signal when it goes through analog-to-digital conversion. Converter 128 converts the filtered analog signal to a digital representation.

Sampling band pass filter 110 preferably includes a programmable clock input 122. Converter 128 also receives programmable sample clock signal at input 124. Anti-aliasing filtering is generally required when the programmable sample clock signals are different at inputs 122 and 124. In most applications, the same sampling clock signal will be used at inputs 122 and 124.

One embodiment of filters 106 and 108 would each be comprised of a bank of several fixed filters which are individually switched between the RF input and the filtered output. In the case of low pass filter 106, the cutoff frequency of each bank filter is on octave increments. In the case of the band pass filter 108, the center frequency of each bank filter is on octave increments, while maintaining the constant shape factor. Other embodiments of the filters are also possible using analog filters with frequency tunable elements.

Figure 2:
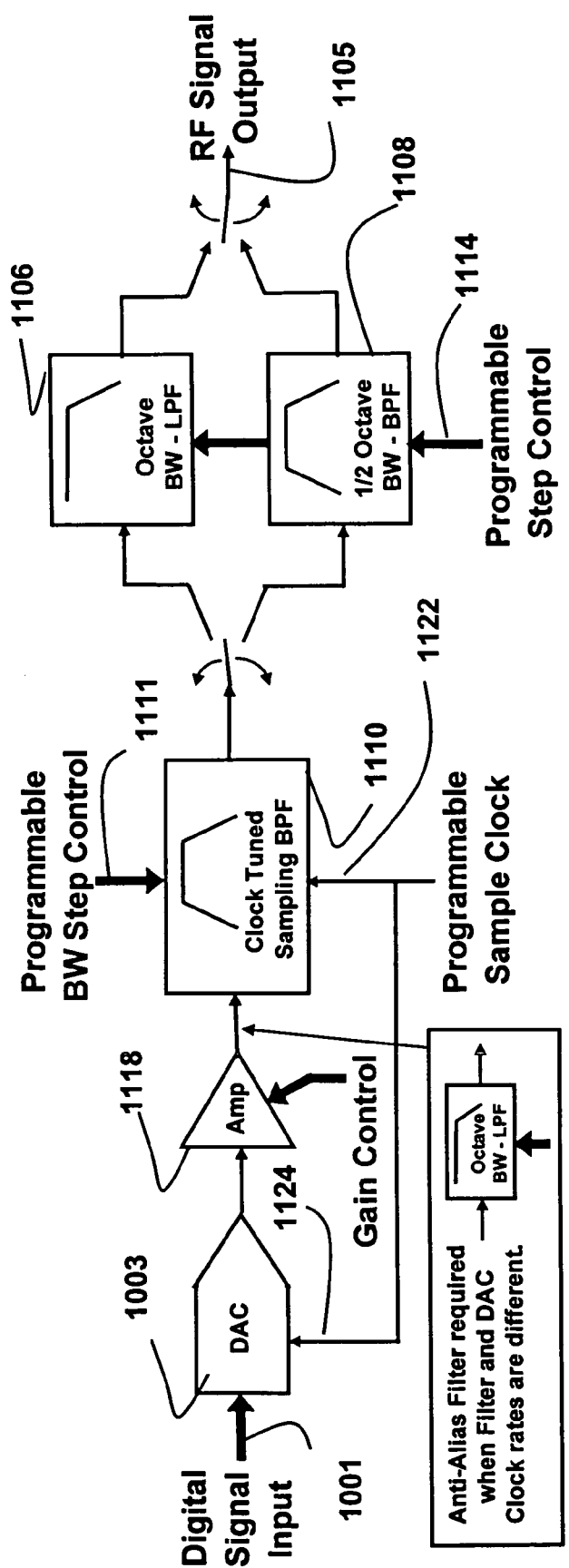
FIG. 2 is a general block diagram of a digital exciter including a programmable IF sampling band pass filter in accordance with another exemplary embodiment in the present invention.

With reference to FIG. 2, exciter 1000 is similar to receiver 100. Similar components are differentiated by 1,000. Components of exciter 1000 are arranged and optimized for exciter operation while components in receiver 100 are optimized and arranged for receiver operation. As shown in FIG. 2, a programmable circuit (clock tuned sampling band pass filter 1110) is utilized to provide IF filtering after a converter 1003 in an exciter application. Together, receiver 100 and exciter 1000 can form at least part of a complete radio system such as a JTRS.

In FIG. 2, a digital signal is provided at digital signal input 1001. Digital-to-analog converter (DAC) 1003 provides an analog signal to amplifier 1118. Amplifier 1118 provides the amplified signal (IF Signal) to clock tuned sampling band pass filter 1110 as compared to clock tuned sampling band pass filter 110 (FIG. 1) providing an amplified signal (amplifier 118) to the ADC (128) input. DAC 1003 and clock tuned sampling band pass filter 1110 receive a sample clock signal at programmable sample clock inputs 1124 and 1122 respectively. The IF signal from filter 1110 is provided in a first path through the octave bandwidth low pass filter 1106 to RF signal output 1105 and a second path through the ½ octave bandwidth band pass filter 1108 to RF signal output 1105. Filters 1106 and 1108 receive a programmable step control signal or bandwidth control signal at control input 1114.

Filters 1106 and 1108 are similar to filters 106 and 108, respectively (FIG. 1). In one embodiment, filter 1110 achieves the advantages of filler 110 discussed above. Filter 1110 receives the programmable sampling clock signal at input 1122 and the bandwidth control signal at input 1111.

Figure 3:
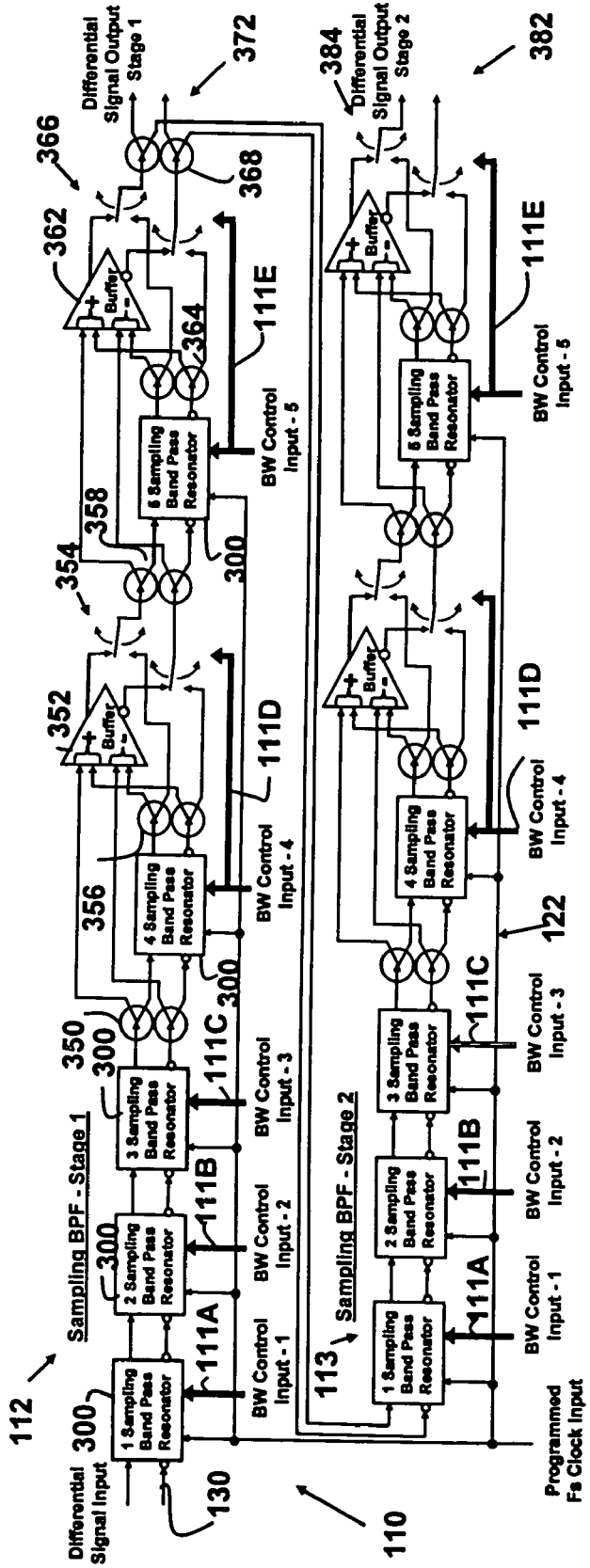
FIG. 3 is a more detailed block diagram of the band pass filter employed in FIGS. 1 and 2 in accordance with another exemplary embodiment.

In FIG. 3, filter 110 includes a differential input 130 and two differential outputs 372 and 382. Filter 110 in FIG. 3 can be utilized as filter 110 (FIG. 1) and/or filter 1110 (FIG. 2). In one embodiment, filter 110 is embodied as a two stage clock tuned sampling band pass filter. Each of stages 112 and 113 includes five sampled signal resonators 300. The number of stages and sampled signal resonators in each stage are examples only and are not shown in a limiting fashion.

Stages 112 and 113 are described as including the same components. However, stages 112 and 113 can be optimized to have different components and different numbers of components. Depending upon filter design criteria, sampled signal resonators, delay paths, inversion patterns, etc., components such as switches, batteries, splitter, and sampled signal resonators can be added and removed from within filters 110 and/or 1110.

Stage 112 includes five cascaded sampled signal resonators 300 and stage 113 includes five cascaded sampled signal resonators 300. The fourth and fifth sampled signal resonators in each stage are configured with switch selectable band pass or band reject sampled signal resonator responses.

A pair of splitters 350 is provided between the third and fourth sampled signal resonators and a buffer 352. A pair of splitters 356 is provided between the fourth sampled signal resonator 300 and buffer 352 and a pair of selection switches 354. The input of splitters 350 is coupled to the output of the third sampled signal resonator 300 and the output of splitters 350 is coupled to buffer 352 and the fourth sampled signal resonator 300. The output of the fourth sampled signal resonator 300 is coupled to the input of splitters 356. The output of splitters 356 is coupled to the input of selection switches 354 and as an inverted signal to the input of buffer 352. The output of buffer 352 is coupled to the other input of selection switches 356. The output of selection switches 356 is the dual mode sampled signal resonator output.

A pair of splitters 358 is provided between selection switches 354 and fifth sampled signal resonator 300 and a buffer 362. A pair of splitters 364 is provided between the fifth sampled signal resonator 300 and buffer 362 and a pair of selection switches 366. The input of splitters 358 is coupled to the output of selection switches 354 and the output of splitters 358 is coupled to buffer 362 and the fifth sampled signal resonator 300. The output of the fifth sampled signal resonator 300 is coupled to the input of splitters 364. The output of splitters 364 is coupled to the selection switches 366 input and as an inverted signal to buffer 362 input. The output of buffer 362 is coupled to the other selection switches 356 input. The output of selection switches 366 is coupled to a pair of splitters 368, which include a first output coupled to a first sampled signal resonator 300 of stage 113 and a second output coupled to provide differential signal output 372.

Selection switches 354 and 366 receive a bandwidth control signal input to select band pass or band reject sampled signal resonator responses. In one embodiment, switches 354 received a bandwidth control signal on an input 111D and switches 366 receive the bandwidth control signal at input 111E.

Stage 113 is configured similar to stage 112 and includes a differential output 382 provided from a pair of selection switches 384. Like stage 112, stage 113 includes 5 sampled signal resonators, 2 selection switch pairs, and 4 splitter pairs coupled together as described above and shown in FIG. 3.

Filter 110 and/or 1110 can be embodied in a variety of other configurations of cascaded sampled signal resonator stages. In alternative embodiments, "$P_s$" band pass sampled signal resonators plus "$R_s$" band reject sampled signal resonators in cascade configuration in "S" cascaded filter stages can be utilized. For example, a 3 stage filter could have stage 1 with four "P" and zero "R" sampled signal resonators, stage 2 with three "P" and two "R" sampled signal resonators, and stage 3 with two "P" and four "R" sampled signal resonators. Preferably, all sampled signal resonators 300 are tuned from a common sample clock via signal input 122.

Bandwidth and shape factor control is preferably via symmetrical sampled signal resonator frequency offset placement for filter band passes that are centered on the previously specified carrier frequency options. However, when it is desired to provide non-standard filter band pass shaping, the filter can be configured for band pass responses with frequency offsets and varying pass amplitude levels verses frequency. For example, a filter exhibiting two separate band pass responses can be configured from a cascaded combination of frequency offset band pass and band reject sampled signal resonators.

Each of sampled signal resonators 300 in each stage 112 and 113 includes attenuators and paths controlled by the bandwidth control signal. In one embodiment, the first 3 sampled signal resonators are each controlled by a portion of the bandwidth control signal provided on bandwidth control inputs 111A, 111B and 111C, respectively. The fourth sampled signal resonator and switches 354 are controlled by a portion of bandwidth control signal on input 111D. The fifth sampled signal resonator and switches 366 are controlled by the portion of the bandwidth control signal on input 111E.

In one embodiment, by selecting a path in which the output of the fourth sampled signal resonator 300 is subtracted from the output of the third sampled signal resonator 300 in buffer 352, a band reject frequency response shape can be achieved. In another embodiment, by utilizing a path in which the output of fifth sampled signal resonator 300 is subtracted from the output of buffer 352 or fourth sampled signal resonator 300 in buffer 362, a band reject frequency response shape can be achieved. Various paths can be provided through stages 112 and 113 as is apparent in FIG. 3.

Figure 4:
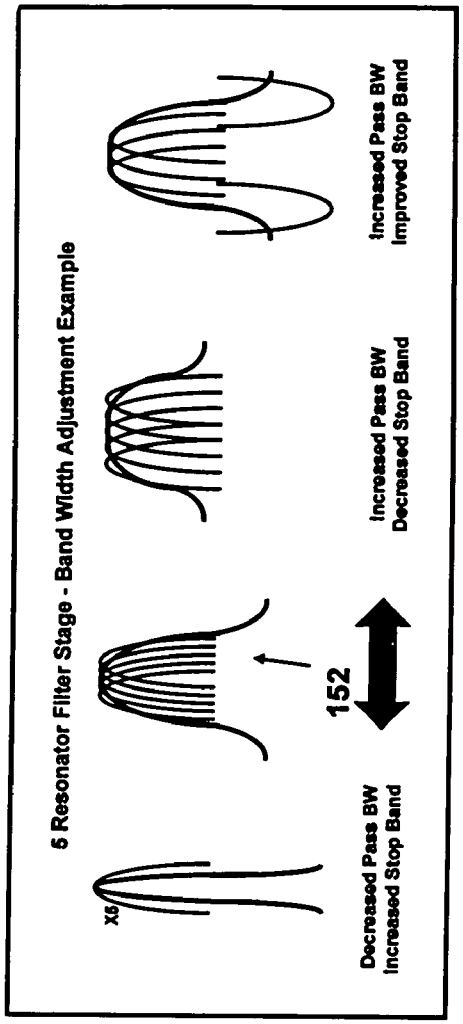
FIG. 4 is a set of waveform diagrams showing bandwidth adjustment for the filter illustrated in FIG. 3 in accordance with yet still another exemplary embodiment.

With reference to FIG. 4, example filter frequency responses are shown using filter 110 and/or 1110. Advantageously, the bandwidth of filter 110 and/or 1110 can be adjusted to achieve various pass bands and various stop band shapes. FIG. 4 shows waveforms 152 including a variety of bandwidth adjustments controllable through the use of bandwidth control signal on inputs 111A-E. As can be seen, the pass band bandwidth can be increased and decreased as well as the stop band frequency suppression to provide a variety of shapes. Each of the shapes is attainable using the filter 110 and/or 1110 illustrated in FIG. 3.

Waveforms 152 are achievable by selecting the appropriate combination of band pass and band reject responses for each sampled signal resonator 300, the appropriate amplitude and frequency offset for each sampled signal resonator 300, and the appropriate number of stages 112 and 113 using circuitry within sampled signal resonators 300 and switches 354 and 366. The first waveform 152 shows an example of 5 cascaded band pass sampled signal resonator frequency responses all with the same center frequency leading to a narrow bandwidth with high stop band rejection. In the second example, the 5 cascaded sampled signal resonator frequency responses are disbursed higher and lower in frequency to widen the filter bandwidth as shown, by using individually set frequency offset control. The result is a wider pass bandwidth, but a reduced stop band frequency rejection. In the third example, the resonator center frequencies are disbursed even further as shown, to further increase the pass bandwidth, but with still further reduction in stop band rejection. The last example shows configuring the outside 2 band pass sampled signal resonators from example 3 as band reject sampled signal resonators, resulting in basically the same pass bandwidth as example 3, but with greater stop band rejection.

Figure 5:
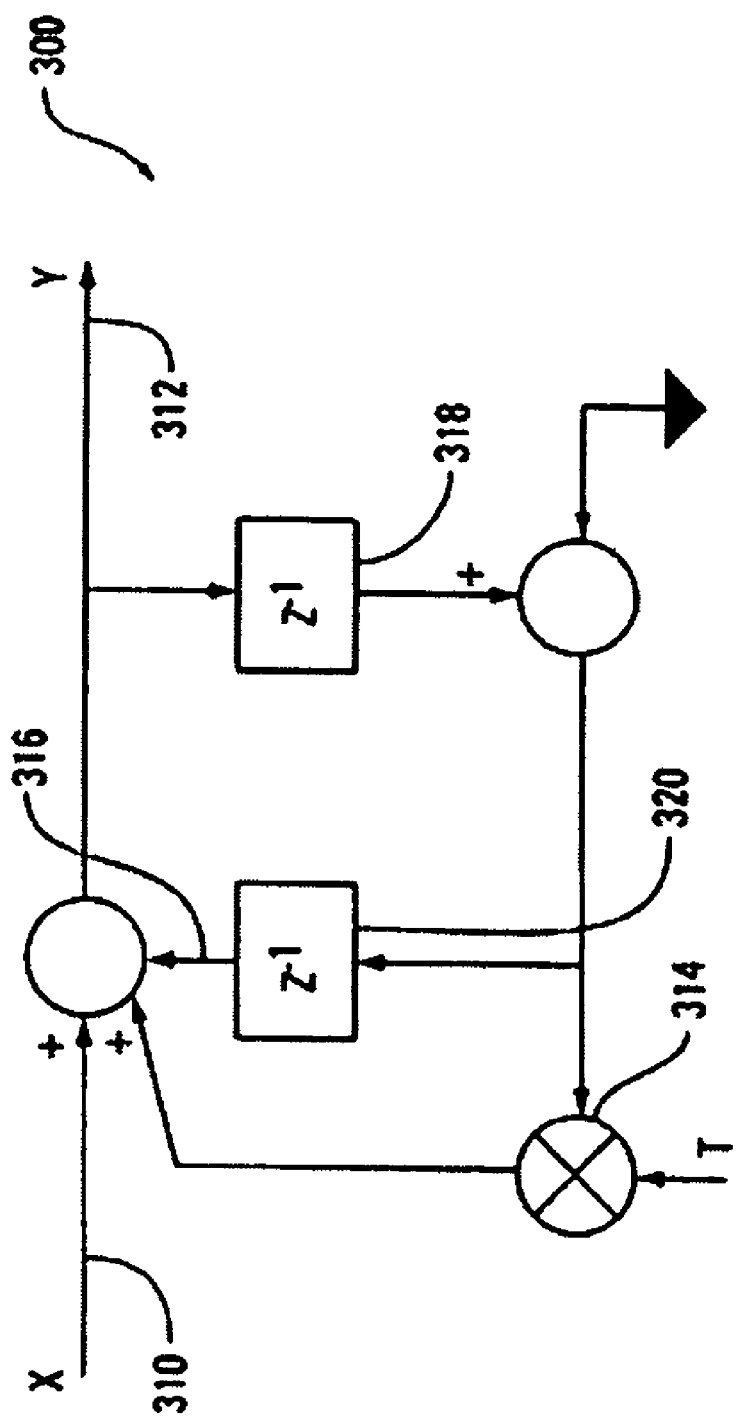
FIG. 5 is a digital transfer function based, detailed block diagram of a sampled signal resonator for use in the filter illustrated in FIG. 3 in accordance with yet another exemplary embodiment.

With reference to FIG. 5, a digital transfer function based embodiment of sampled signal resonator 300 is shown as a tunable band pass filter stage or sampled signal resonator. The tunable band pass filter stage or sampled signal resonator is disclosed in U.S. Pat. No. 6,232,901 issued to Duane L.

Abbey on May 15, 2001 and can be utilized to investigate the sampled signal resonator 300 frequency response as used in filters 110 and 1110 in accordance with the present invention.

The tunable band-pass filter stage or sampled signal resonator 300 is capable of producing a tunable constant Q filter response for each stage, relative to the sample clock variation. The transfer function for the tunable band-pass filter stage or sampled signal resonator, as shown on FIG. 5, is as follows: $Y=X/[1-TZ^{-1}+Z^2]$; $T=2 \cos \Theta_s$ where $\Theta_s$=frequency angle relative to the sample rate. The negative input summed with the 318 delay output on FIG. 5 is not utilized in this application and is disabled with the applied ground input.

As shown in Table 1 below, listing example values of the tune gain element "T" versus tune frequency, $-2 \leq T \leq 2$ tunes the center frequency from Nyquist ($F_s/2$) down to dc (i.e., 0 Hz).

TABLE 1

Tune Gain Element Values, T, versus Tune Frequency

| T | $\Theta_s$ degrees | Frequency |
|---|---|---|
| 0 | 90 | $F_s/4$ |
| 0.5 | 75.5 | $F_s/5$ |
| -0.5 | 104.5 | $3 F_s/10$ |
| 1 | 60 | $F_s/6$ |
| -1 | 120 | $F_s/3$ |
| 1.99 | 5.7 | $2 F_s/125$ |
| 2 | 0 | dc |
| -2 | 180 | $F_s/2$ |

Because of sampling theory, when a tunable band-pass is created at $F_C$, it is also created at $F_s-F_C$, $F_s+F_C$, $2F_s-F_C$, etc. In order to maintain constant "Q" performance and predictable "T" value to frequency relationships, the delay from 312 output to 316 input should be twice the delay from 312 output to 314 output (summer input). Sampled signal resonator 300 can be utilized in any of the stages associated with tune sampling band pass filter 110 and/or 1110.

Figure 6:
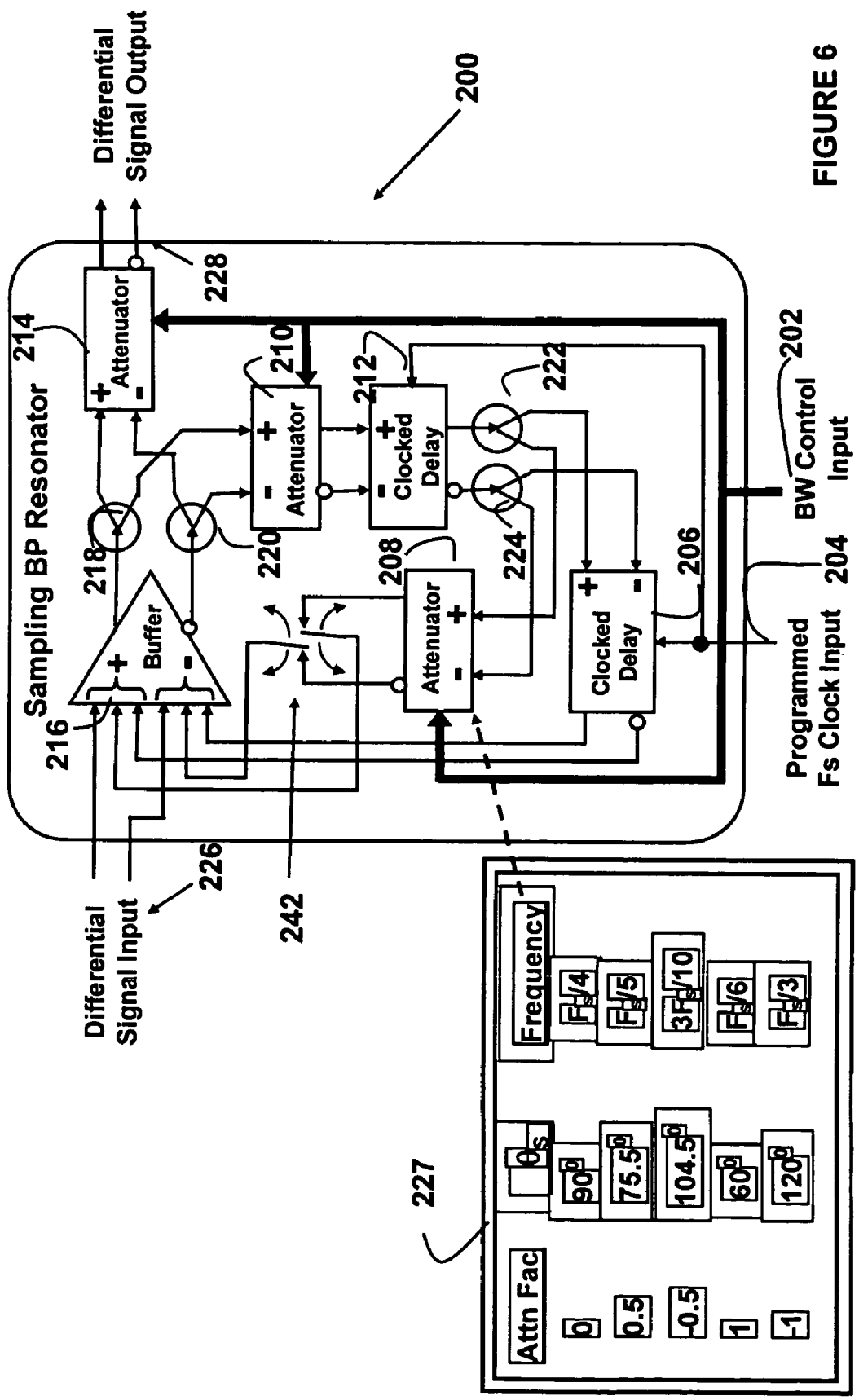
FIG. 6 is a digital sampling circuits based, detailed block diagram of another sampled signal resonator for use in the filter illustrated in FIG. 3 in accordance with yet another exemplary embodiment.

With reference to FIG. 6, an exemplary sampling band pass sampled signal resonator 200 can be utilized as sampled signal resonator 300 in FIG. 3. Sampled signal resonator 200 includes a bandwidth control input 202, a programmed $F_S$ clock input 204, clock delay circuits 206 and 212, reversible (loss/gain) attenuators 208, 210, and 214, a buffer 216, a selection switch 242, splitters 218, 220, 222, and 224, differential signal input 226 and differential signal output 228. Bandwidth control input 202 preferably receives a signal that controls reversible (loss/gain) attenuators 208, 210, and 214. Programmed $F_S$ clock input 204 preferably provides signals to clock delay circuits 206 and 212.

Clock delay circuits 212 and 206 are preferably embodied as sample and hold amplifier pairs. Reversible (loss/gain) attenuators 208, 210 and 214 allow for the production of desired plus or minus frequency offsets from one quarter of the sampling frequency, as well as for the control of sampled signal resonator stability and net sampled signal resonator transfer gain.

Band pass sampled signal resonator 200 is one embodiment of sampled signal resonator 300, described with reference to FIG. 3. In FIG. 6, Table 227 shows the application of reversible (loss/gain) attenuation factors, which are equivalent to the "T" factors in Table 1, to sampled signal resonator 200. The reversible (loss/gain) attenuator 208 output is equivalent to its input after amplitude adjustment (multiplication) by the loss/gain factor.

According to one embodiment, signal bandwidths of 3 megahertz to 7.5 megahertz (−3 dB BW) can be reached at sample rates of 300 megahertz and filter "Q" of 10 to 25. In another embodiment, harmonic sample rates of 800 megahertz and filter "Q" of 10 to 25 reach signal bandwidths of 8 megahertz to 20 megahertz (−3 dB BW). In yet another embodiment, harmonic sample rates at 1600 megahertz and filter "Q" of 10 to 25 reach signal bandwidths of 16 megahertz to 40 megahertz (−3 dB BW). The applicant has found that simulations demonstrated that the filter architecture is readily implementable in modern integrated circuit technologies, including silicon germanium bicmos technology. The architecture is also readily implemented into alternate configurations including more or less band pass sampled signal resonators per stage, more or less band reject sampled signal resonators per stage, and more or less stages per filter. Enhanced shape factor and/or bandwidth performance is also possible. The architecture can be adjusted to meet the needs of filter performance requirements.

Figure 7:
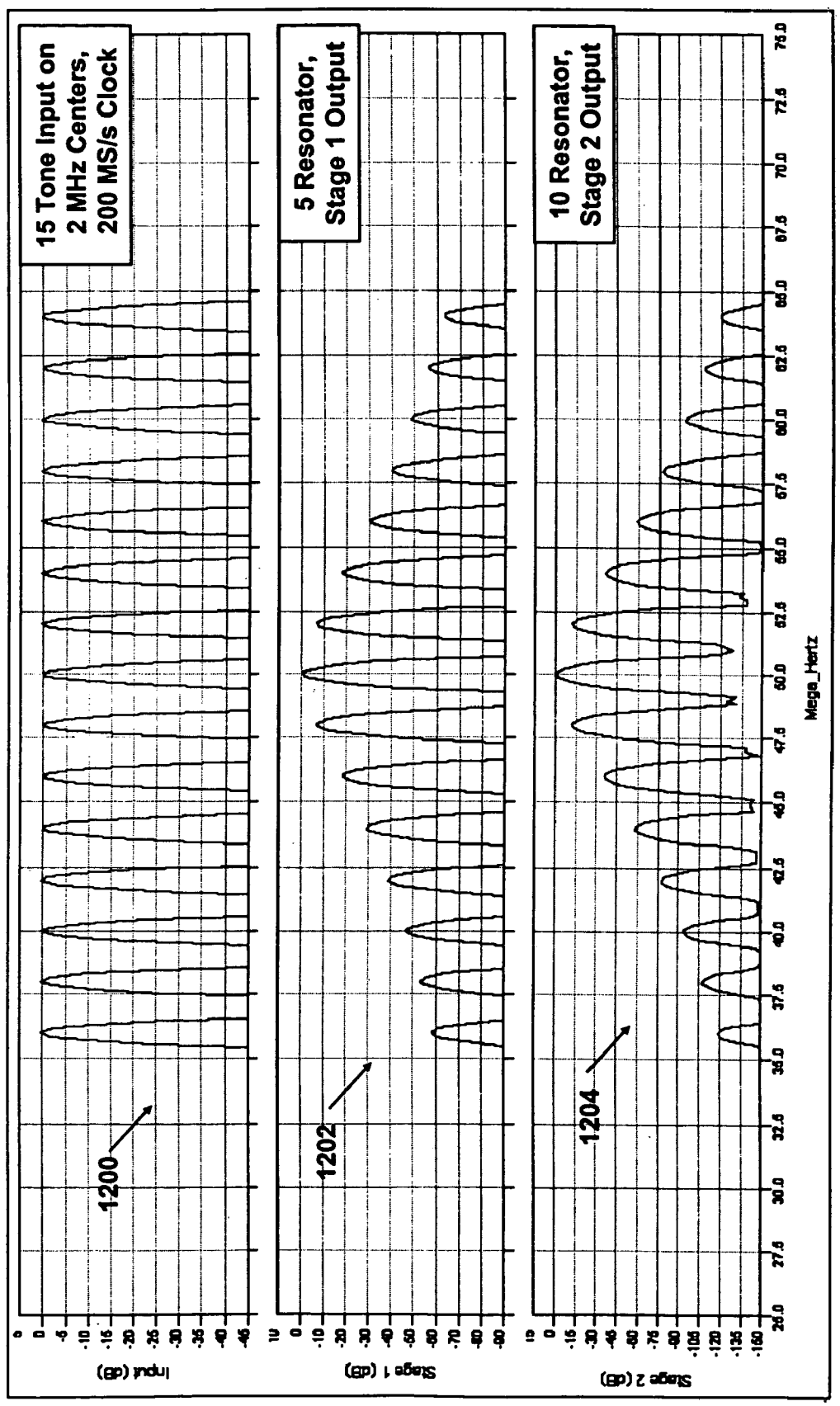
FIG. 7 is a set of waveform diagrams showing filter response to a 15 tone input signal, for the filter illustrated in FIG. 3 at a 200 MHz clock tuned frequency and with bandwidth control signal code set to (0, ±0.0, ±0.0) in accordance with an exemplary embodiment.

In FIG. 7, waveform 1200 shows fifteen tone signals (input on two megahertz centers used) with a 200 megasample per second clock signal at input 130 (FIG. 3). Waveform 1202 shows the output of filter 110 and/or 1110 at differential output 372. Waveform 1204 shows the signal output from filter 110 and/or 1110 at differential output 382. Waveforms 1202 and 1204 are produced providing a bandwidth control signal code of 0, ±0.0, ±0.0. The control signal code lists the reversible (loss/gain) attenuation ("T") factors for resonators 3, 2 & 4, and 1 & 5. In this case all values are zero and therefore all resonators are centered at $F_S/4$=50 MHz, as shown in waveforms 1202 and 1204.

Figure 8:
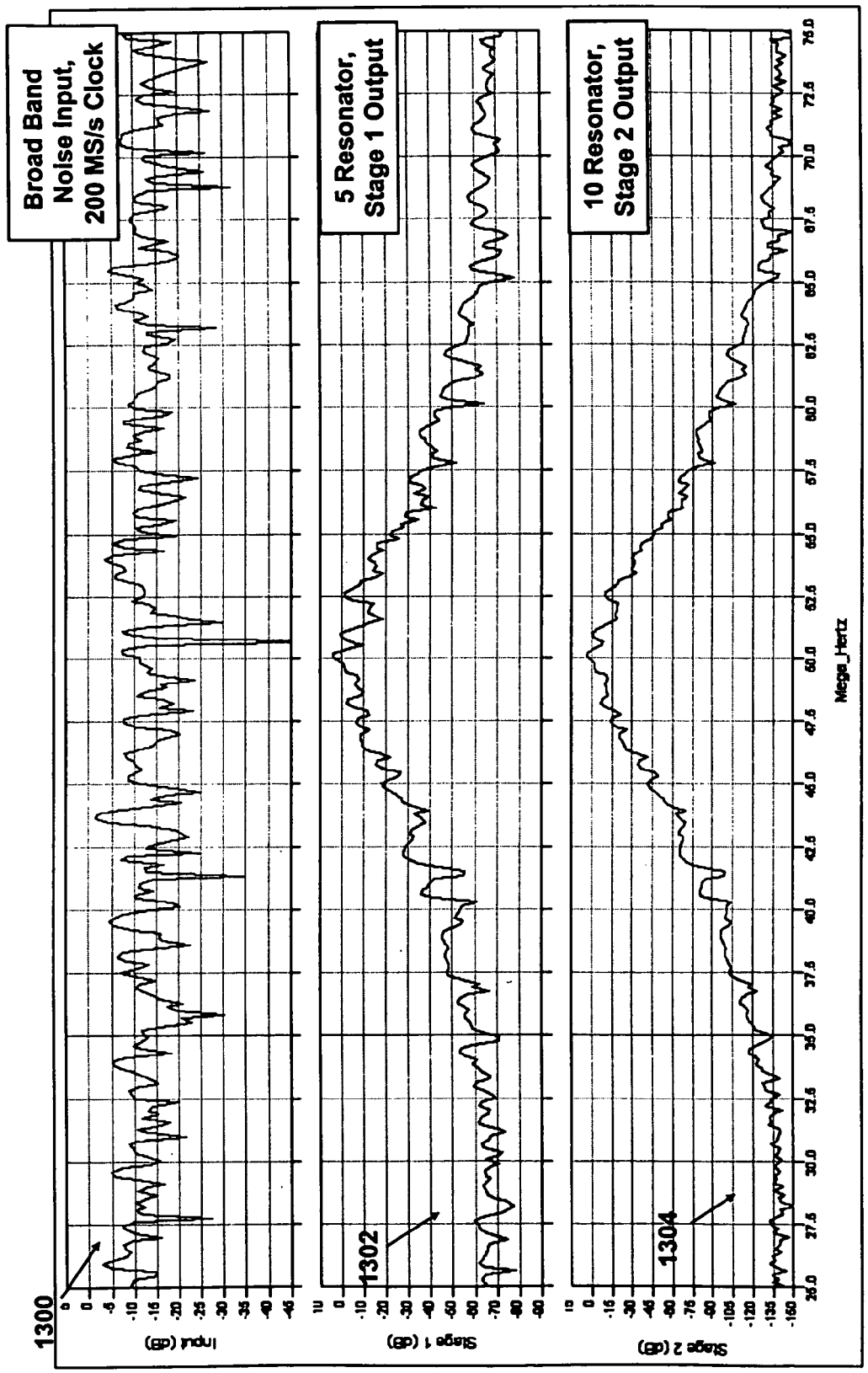
FIG. 8 is a set of waveform diagram showing filter response to a broadband noise input signal, for the filter illustrated in FIG. 3 at a 200 MHz clock tuned frequency and with bandwidth control signal code set to (0, ±0.0, ±0.0) in accordance with an exemplary embodiment.

With reference to FIG. 8, waveform 1300 is a broadband noise input signal spanning 25 megahertz to 75 megahertz, with a sampling clock of 200 megasamples per second. Signal 1300 is provided to differential input 130 of filter 110 and/or 1110. Filter 110 and/or 1110 outputs waveform 1302 at differential output 372 and waveform 1304 at differential output 382. Waveforms 1302 and 1304 are produced using a bandwidth control signal or bandwidth control signal code of 0, ±0.0, ±0.0.

Figure 9:
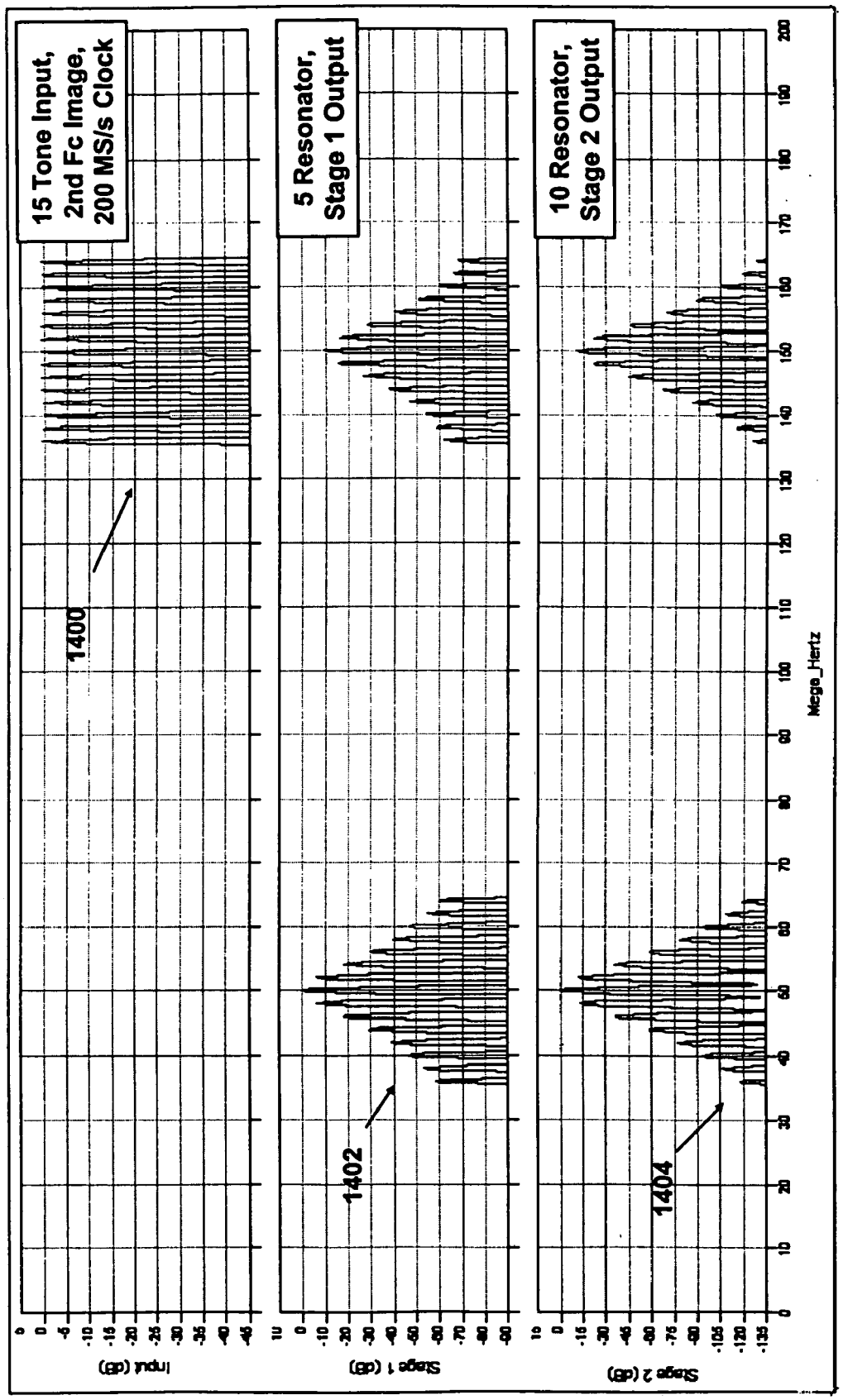
FIG. 9 is a set of waveform diagrams showing frequency expanded filter response to a 15 tone input signal, for the filter illustrated in FIG. 3 at a 200 MHz clock tuned frequency and with bandwidth control signal code set to (0, ±0.0, ±0.0) in accordance with another exemplary embodiment.

With reference to FIG. 9, filter 110 and/or 1110 is configured with a bandwidth control signal code of 0, ±0.0, ±0.0 and receives a 150 megahertz centered, 15 tone harmonically sampled at 200 MS/s, input waveform 1400 at input 130 (FIG. 3). Filter 110 and/or 1110 outputs waveform 1402 at output 372 and waveform 1404 at output 382. Note that the sampling process produces the filter output signals at $F_S/4$ (50 megahertz centered) and the input $3*F_S/4$ (150 megahertz centered).

Figure 10:
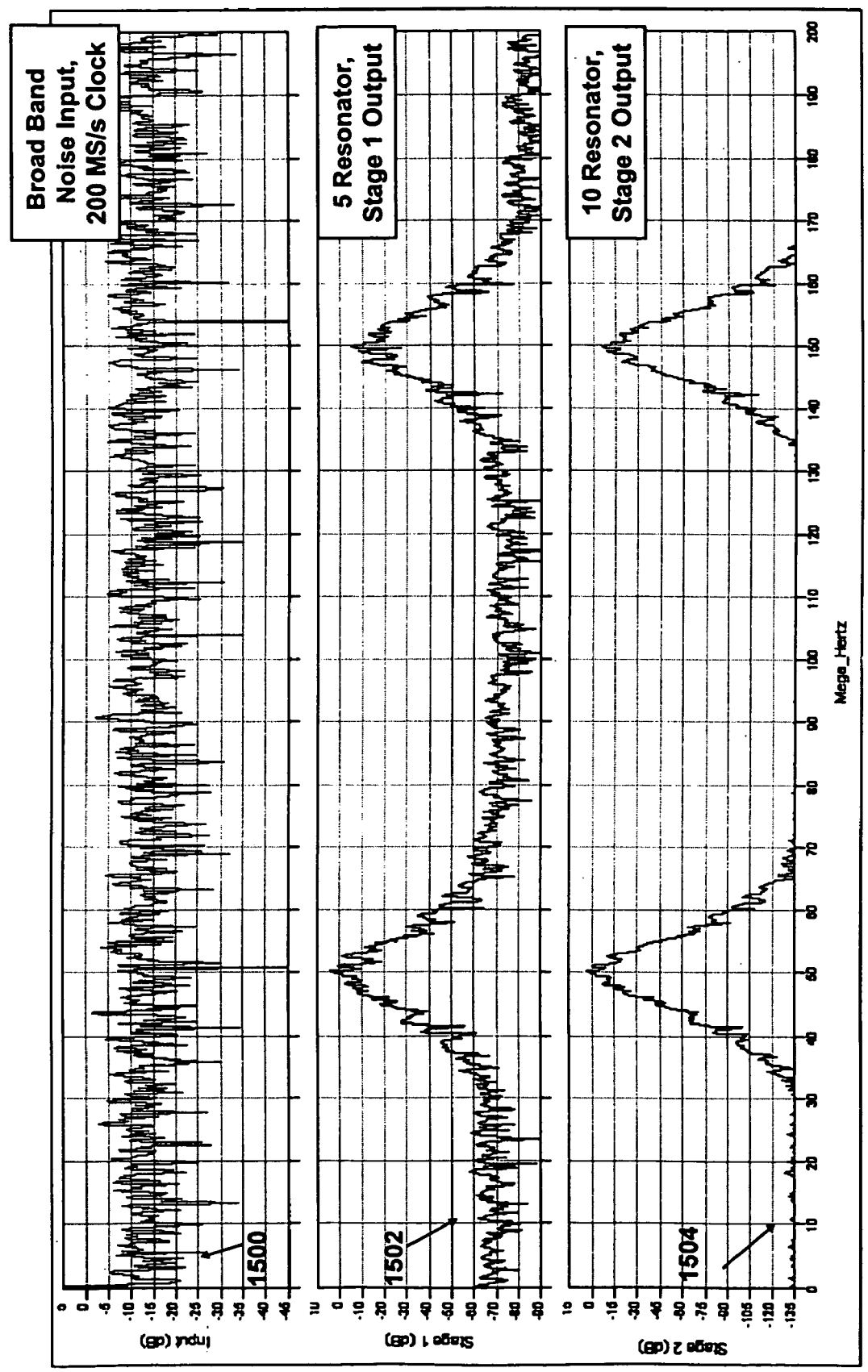
FIG. 10 is a set of waveform diagrams showing frequency expanded filter response to a broadband noise input signal, for the filter illustrated in FIG. 3 at a 200 MHz clock tune frequency and with a bandwidth control signal code set to (0, ±0.0, ±0.0) in accordance with another exemplary embodiment.

With reference to FIG. 10, filter 110 and/or 1110 receives a waveform 1500 at input 130 (FIG. 3). Waveform 1500 is a broadband noise input with 200 megasample per second clock signal. Filter 110 and/or 1110 outputs waveform 1502 at output 372 and waveform 1504 at output 382. The bandwidth control signal code is 0, ±0.0, ±0.0. Note that since the waveform 1500 spans both Nyquist 1 and Nyquist 2 signal sampling regions, the sampled output signals are filtered and aliased combinations of the noise signal from both regions. The sampling process again produces the filter output signals at $F_S/4$ (50 megahertz centered) and at $3*F_S/4$ (150 megahertz centered).

Figure 11:
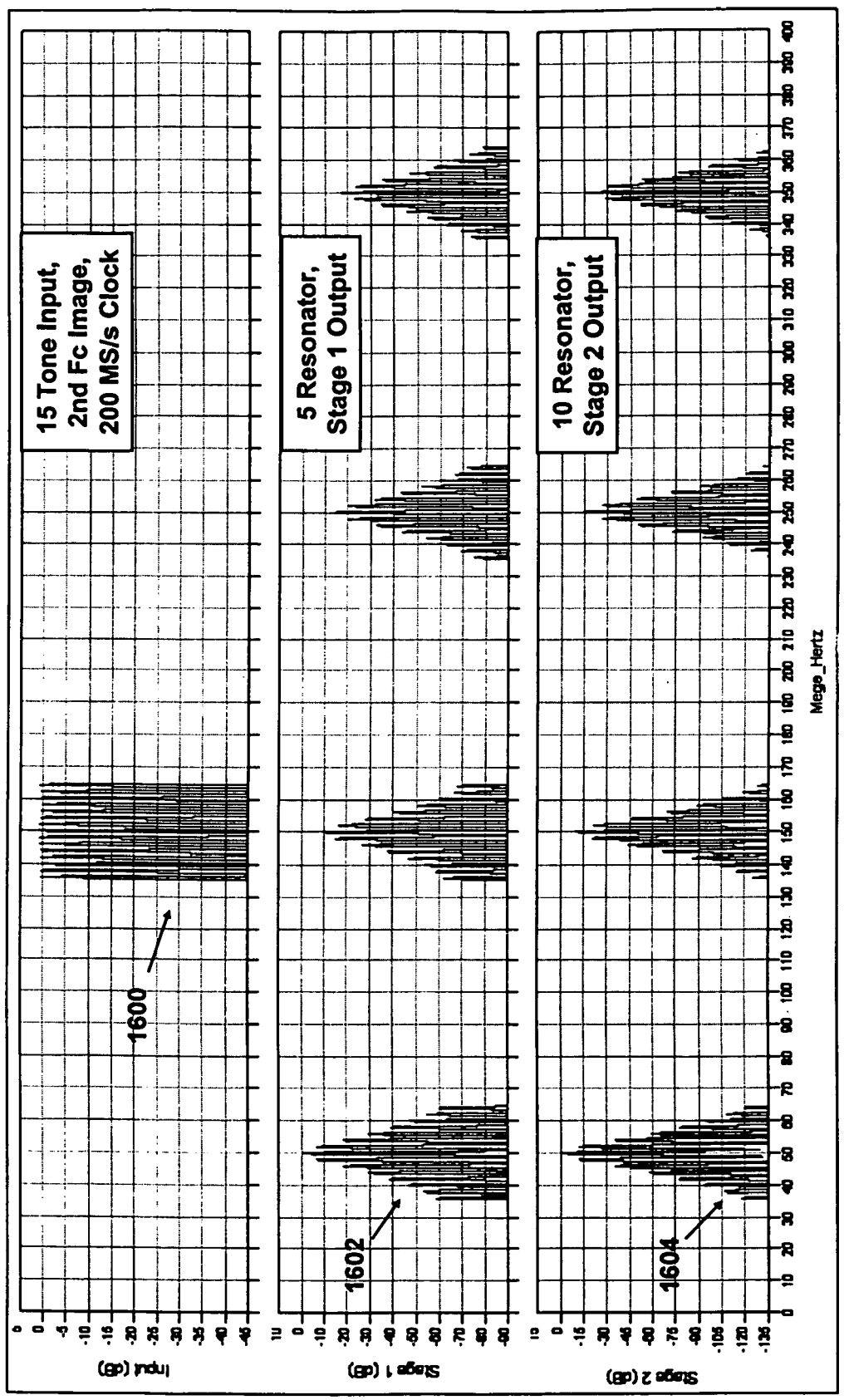
FIG. 11 is a set of waveform diagrams showing further frequency expanded filter response to a 15 tone input signal, for the filter illustrated in FIG. 3 at a 200 MHz clock tuned frequency and with bandwidth control signals code set to (0, ±0.0, ±0.0) in accordance with another with an exemplary embodiment.

With reference to FIG. 11, filter 110 and/or 1110 receives a waveform 1600 at an input 130 (FIG. 3) and provides waveform 1602 and 1604 at outputs 372 and 382, respectively. Waveform 1600 is the same fifteen tone input signal as waveform 1400 of FIG. 9, only the frequency scale is expanded to show Nyquist sampling regions 1 through 4. Output waveforms 1602 and 1604 are produced with a bandwidth control signal code of 0, ±0.0, ±0.0 with a 200 megasample per second clock signal. Note that like waveforms 1402 and 1404 of FIG. 9, the sampling process produces the filter output signals in all Nyquist sampling regions shown, including $F_S/4$ (50 megahertz centered), the input $3*F_S/4$ (150 megahertz centered), $5*F_S/4$ (250 megahertz centered), and $7*F_S/4$ (350 megahertz centered).

Figure 12:
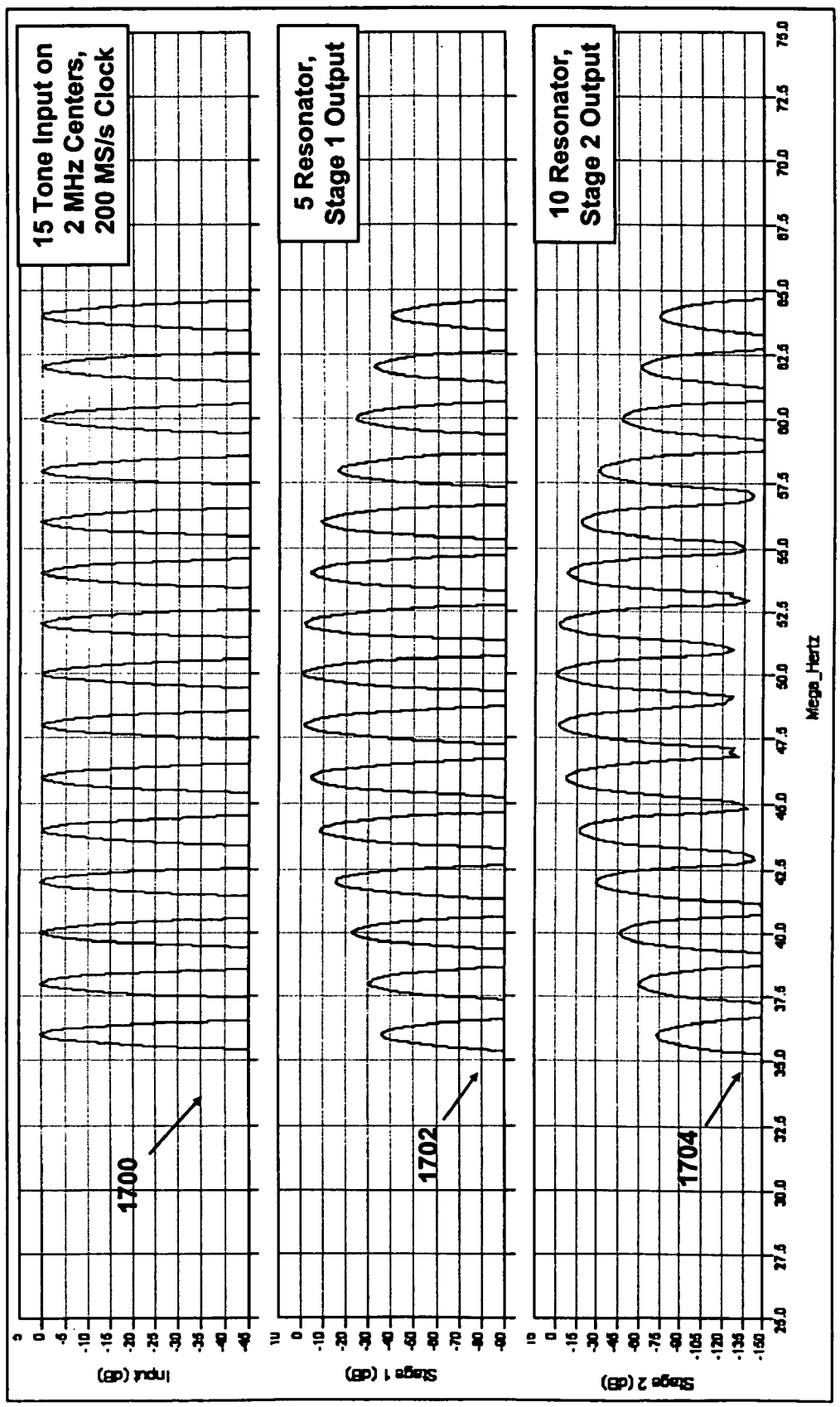
FIG. 12 is a set of waveform diagrams showing the filter response to a 15 tone input signal, for the filter illustrated in FIG. 3 at a 200 MHz clock tuned frequency and with bandwidth control signals code set to (0.0, ±0.25, ±0.5) in accordance with an exemplary embodiment.

With reference to FIG. 12, filter 110 and/or 1110 receives 15 tone input signals on 2 megahertz centers with a 200 megasample per second clock signal as a waveform 1700 at input 130 (FIG. 3). Filter 110 and/or 1110 outputs waveform 1702 at output 372 and waveform 1704 at output 382. With the bandwidth control signal code at "0, ±0.25, ±0.5", the corresponding band pass resonator center frequencies are 50 megahertz, 54 megahertz, 46 megahertz, 60 megahertz, and 40 megahertz respectively. A comparison of waveforms 1702 and 1704 with waveforms 1202 and 1204 (FIG. 7) shows how the filter's pass bandwidth has increased while the stop band suppression performance has decreased.

Figure 13:
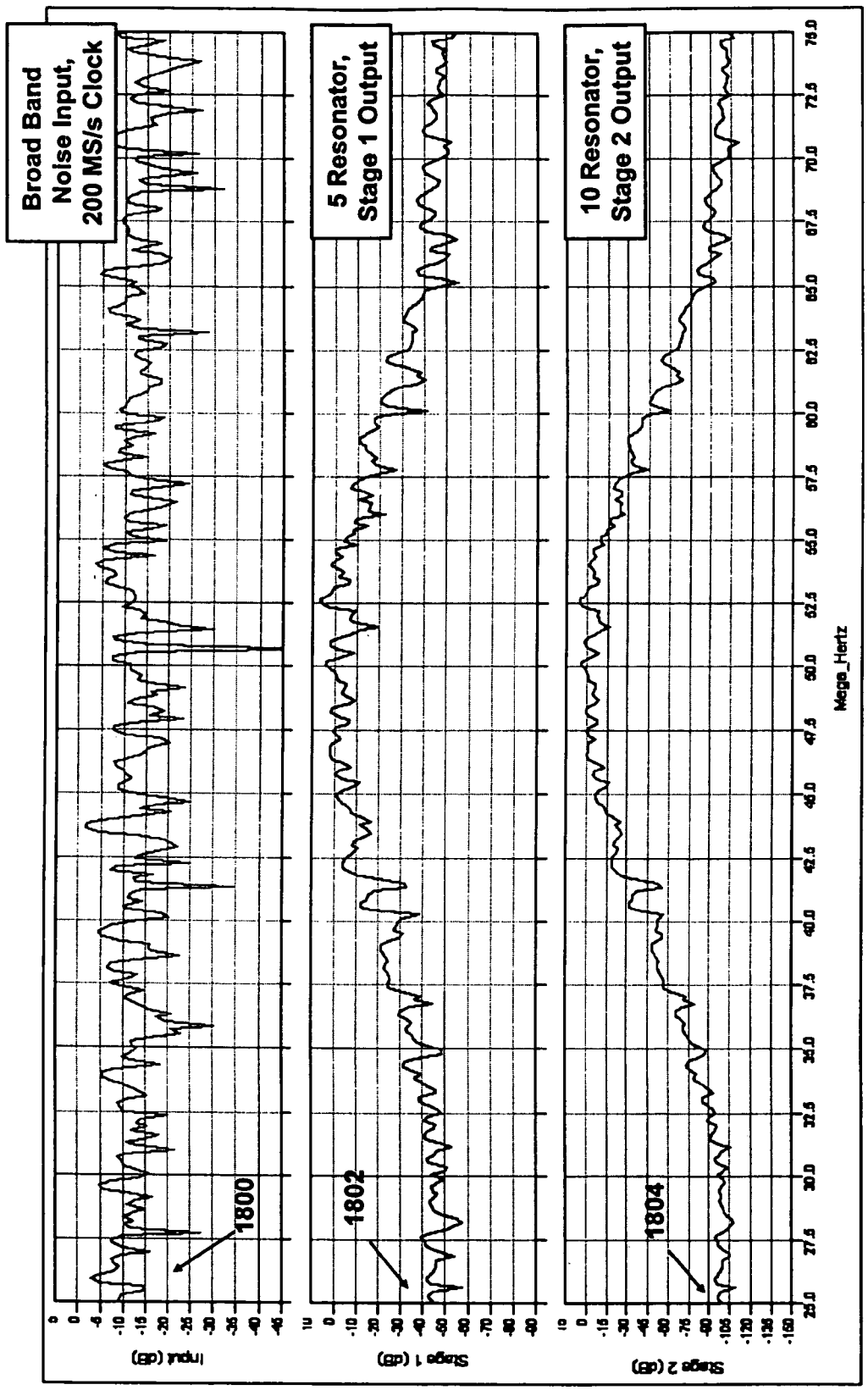
FIG. 13 is a set of waveform diagrams showing the filter response to a broadband noise input signal, for the filter illustrated in FIG. 3 at a 200 MHz clock tuned frequency and with bandwidth control signals code set to (0.0, ±0.25, ±0.5) in accordance with an exemplary embodiment.

With reference to FIG. 13, filter 110 and/or 1110 receives a waveform 1800 at input 130 (FIG. 3). Waveform 1800 is a broadband noise input with a 200 megasample per second clock signal. Filter 110 and/or 1110 outputs waveform 1802 at output 372 and waveform 1804 at output 382. The bandwidth control signal code is 0, ±0.25, ±0.5. A comparison of waveforms 1802 and 1804 with waveforms 1302 and 1304 (FIG. 8) shows how the filter's pass bandwidth has increased while the stop band suppression performance has decreased.

Figure 14:
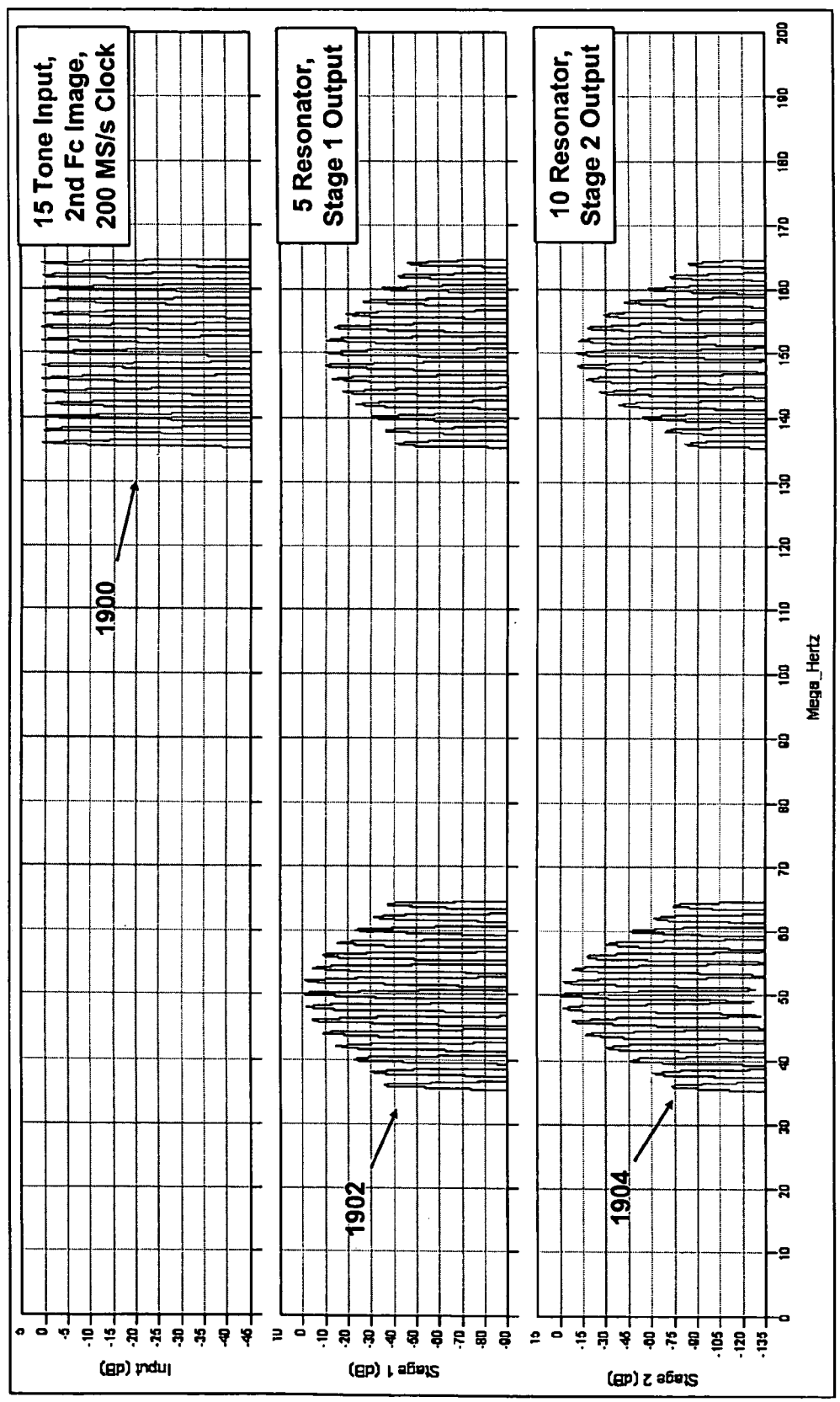
FIG. 14 is a set of waveform diagrams showing the frequency expanded filter response to a 15 tone input signal, for the filter illustrated in FIG. 3 at a 200 MHz clock tuned frequency and with bandwidth control signals code set to (0.0, ±0.25, ±0.5) in accordance with an exemplary embodiment.

With reference to FIG. 14, filter 110 and/or 1110 is configured with a bandwidth control signal code of 0, ±0.25, ±0.5 and receives a 150 megahertz centered, 15 tone harmonically sampled at 200 MS/s, input waveform 1900 at input 130 (FIG. 3). Filter 110 and/or 1110 outputs waveform 1902 at output 372 and waveform 1904 at output 382. A comparison of waveforms 1902 and 1904 with waveforms 1402 and 1404 (FIG. 9) shows how the filter's pass bandwidth has increased while the stop band suppression performance has decreased.

Figure 15:
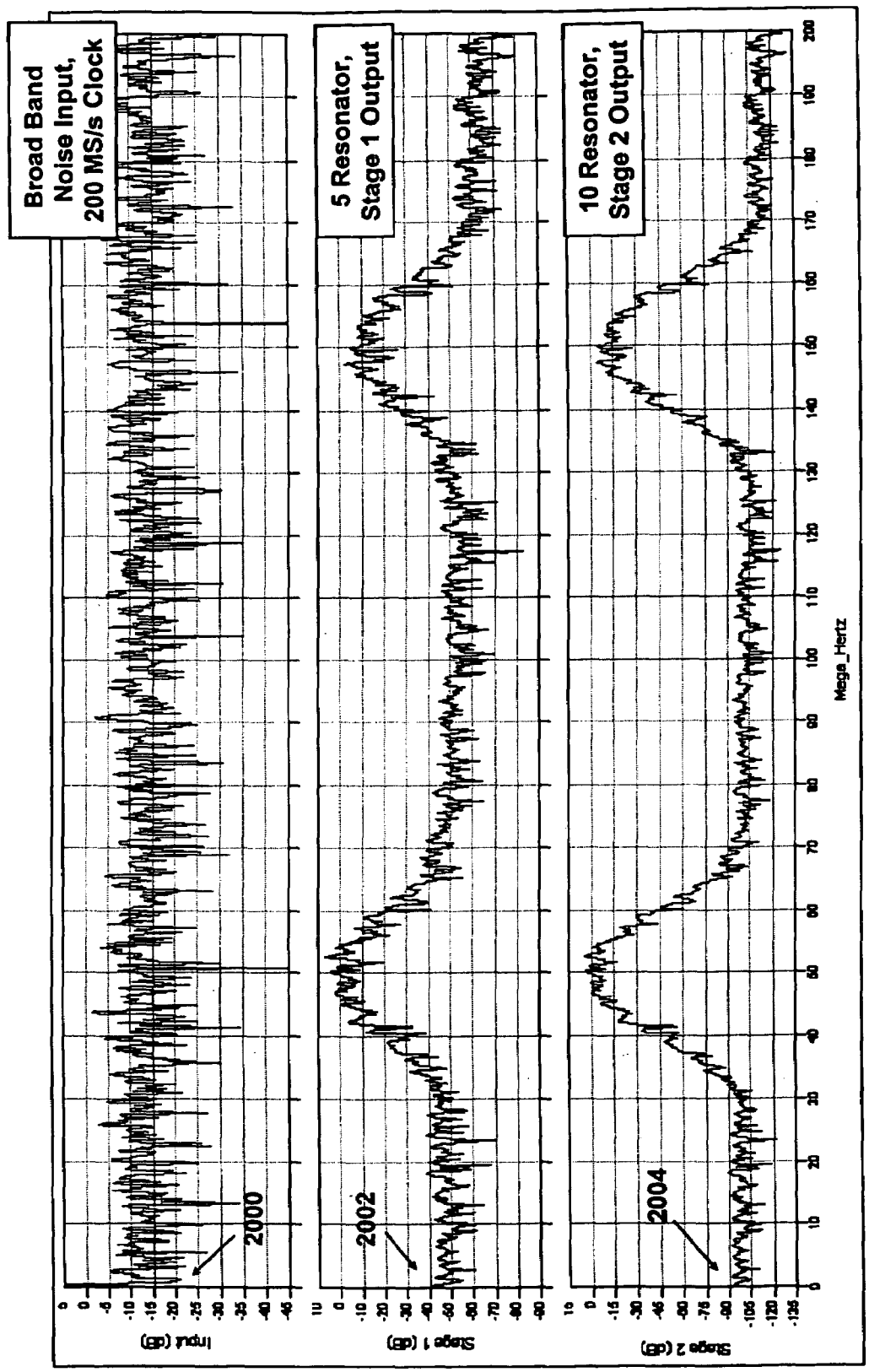
FIG. 15 is a set of waveform diagrams showing the frequency expanded filter response to a broadband noise input signal, for the filter illustrated in FIG. 3 at a 200 MHz clock tuned frequency and with bandwidth control signals code set to (0.0, ±0.25, ±0.5) in accordance with an exemplary embodiment.

With reference to FIG. 15, filter 110 and/or 1110 receives waveform 2000 at input 130 (FIG. 3). Waveform 2000 is a broadband noise input with a 200 megasample per second clock signal. Filter 110 and/or 1110 outputs waveform 2002 at output 372 and waveform 2004 at output 382. The bandwidth control signal code is 0, ±0.25, ±0.5. Note that since the waveform 2000 spans both Nyquist 1 and Nyquist 2 signal sampling regions, the sampled output signals are filtered and aliased combinations of the noise signal from both regions. A comparison of waveforms 2002 and 2004 with waveforms 1502 and 1504 (FIG. 10) shows how the filter's pass bandwidth has increased while the stop band suppression performance has decreased.

Figure 16:
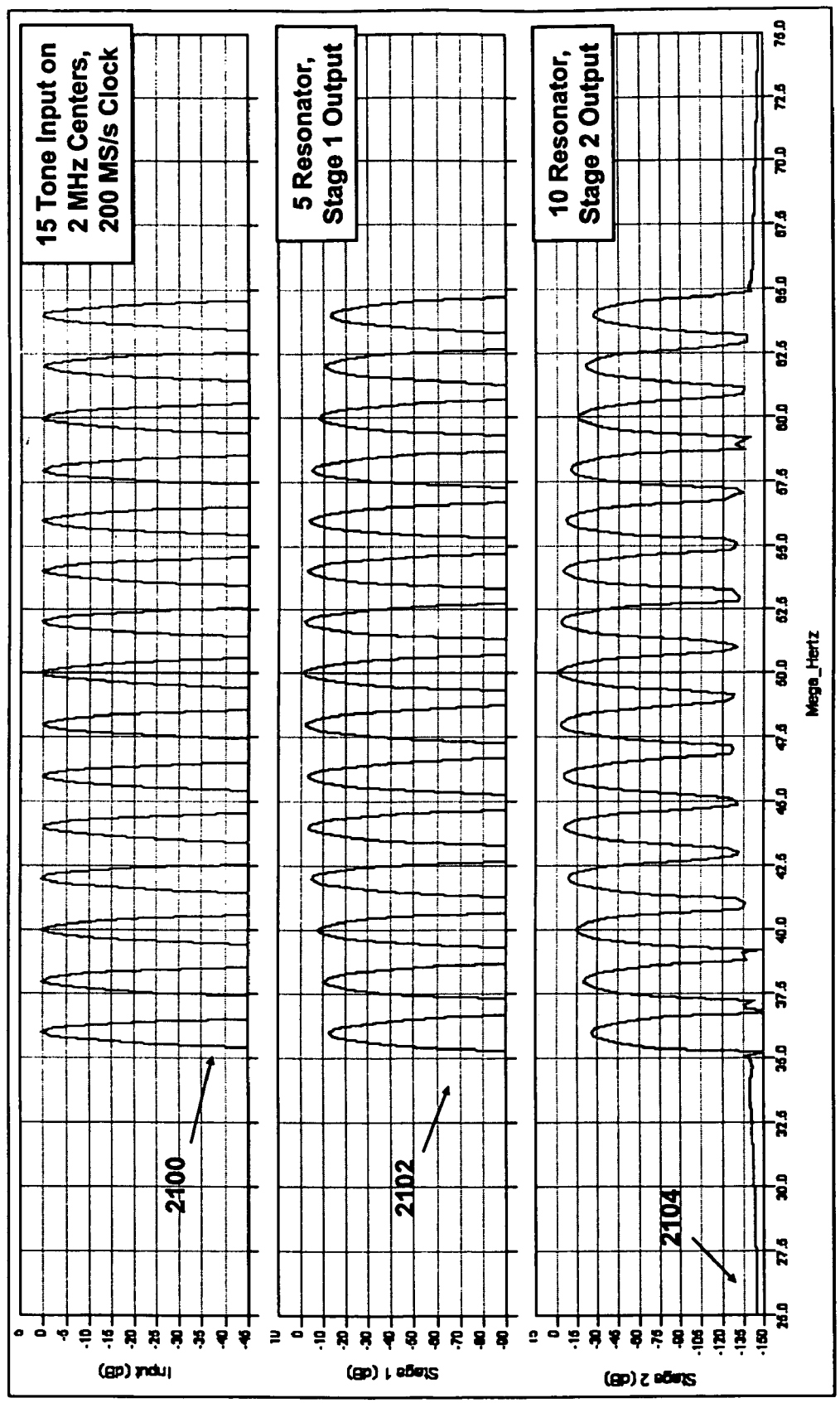
FIG. 16 is a set of waveform diagrams showing the filter response to a 15 tone input signal, for the filter illustrated in FIG. 3 at a 200 MHz clock tuned frequency and with bandwidth control signals code set to (0.0, ±0.5, ±1.0) in accordance with an exemplary embodiment.

With reference to FIG. 16, filter 110 and/or 1110 receives a waveform 2100 at an input 130 (FIG. 3). Waveform 2100 includes 15 tone input signals on 2 megahertz centers and is received with a 200 megasample per second clock signal. Filter 110 and/or 1110 outputs waveform 2102 at output 372 and waveform 2104 at output 382. With the bandwidth control signal code at "0, ±0.5, ±1", the corresponding band pass sampled signal resonator center frequencies are 50 megahertz, 60 megahertz, 40 megahertz, 66.67 megahertz, and 33.33 megahertz respectively. A comparison of waveforms 2102 and 2104 with waveforms 1202 and 1204 (FIG. 7) as well as 1702 and 1704 (FIG. 12) shows how the filter's pass bandwidth has further increased while the stop band suppression performance has further decreased.

Figure 17:
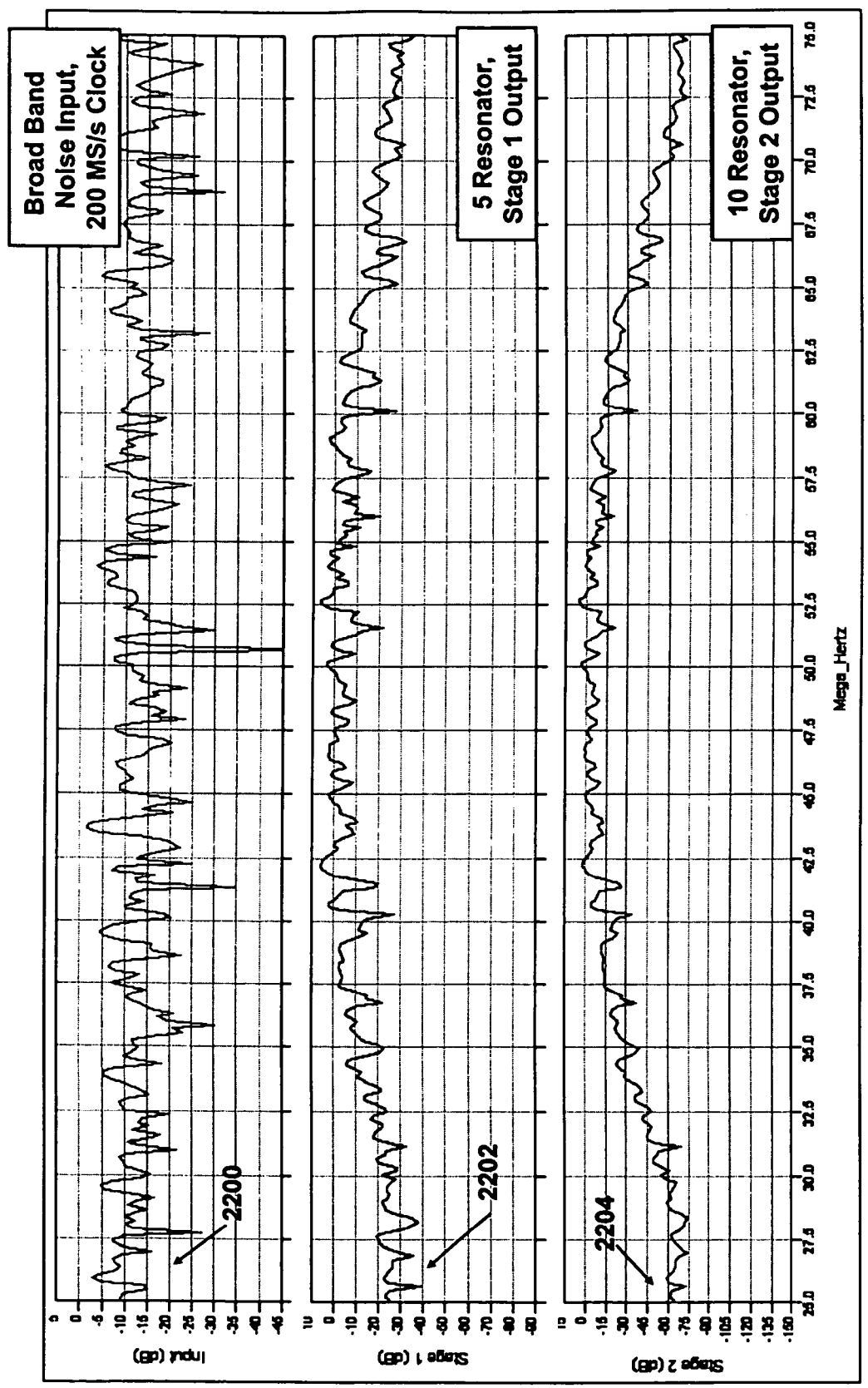
FIG. 17 is a set of waveform diagrams showing the filter response to a broadband noise input signal, for the filter illustrated in FIG. 3 at a 200 MHz clock tuned frequency and with bandwidth control signals code set to (0.0, ±0.5, ±1.0) in accordance with an exemplary embodiment.

With reference to FIG. 17, filter 110 and/or 1110 receives a waveform 2200 at input 130 (FIG. 3). Waveform 2200 is a broadband noise input with a 200 megacycle per second clock signal. Filter 110 and/or 1110 outputs waveform 2202 at output 372 and waveform 2204 at output 282. The bandwidth control signal code is 0, ±0.5, ±1. A comparison of waveforms 2202 and 2204 with waveforms 1302 and 1304 (FIG. 8) as well as 1802 and 1804 (FIG. 13) shows how the filter's pass bandwidth has further increased while the stop band suppression performance has further decreased.

Figure 18:
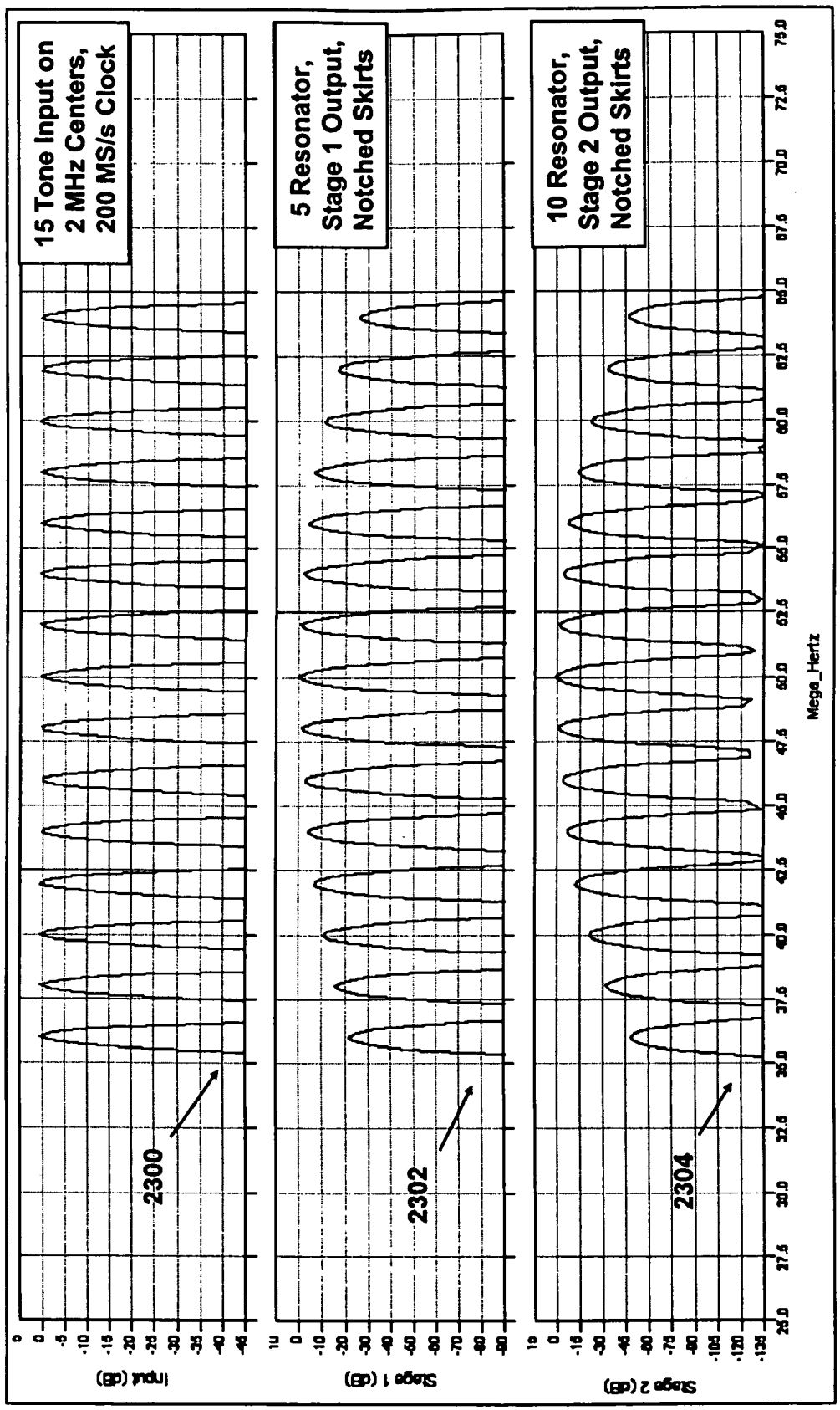
FIG. 18 is a set of waveform diagrams showing the filter response to a 15 tone input signal, for the filter illustrated in FIG. 3 at a 200 MHz clock tuned frequency and with bandwidth control signals code set to (0.0, ±0.5, ±1.0 INV) in accordance with an exemplary embodiment.

With reference to FIG. 18, filter 110 and/or 1110 receives a waveform 2300 at input 130 (FIG. 3). Waveform 2300 includes 15 tone input signals on 2 megahertz centers received with a 200 megasample per second clock signal. Filter 110 and/or 1110 outputs waveform 2302 at output 372 and waveform 2304 at output 382. The bandwidth control signal code is 0, ±0.5, ±1 INV. With the bandwidth control signal code at "0, ±0.5, ±1 INV", the corresponding band pass sampled signal resonator center frequencies are 50 megahertz, 60 megahertz, and 40 megahertz, and the band reject sampled signal resonator center frequencies are 66.67 megahertz and 33.33 megahertz respectively. The "INV" code indicator is to designate the sampled signal resonators as band reject (or response inverted). A comparison of waveforms 2302 and 2304 with waveforms 2102 and 2104 (FIG. 17) shows how the filter's pass bandwidth is basically the same while the stop band suppression performance has increased.

Figure 19:
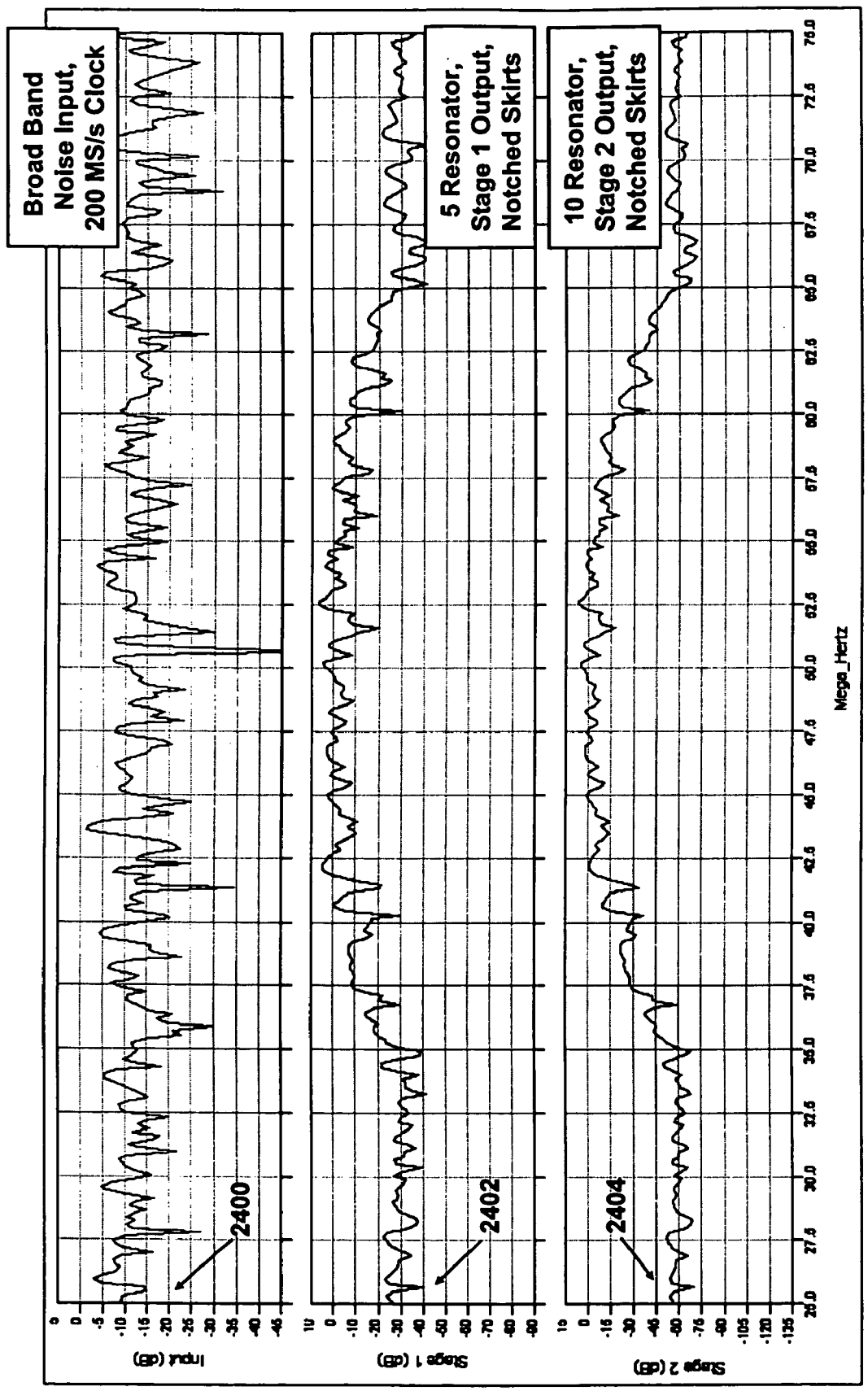
FIG. 19 is a set of waveform diagrams showing the filter response to a broadband noise input signal, for the filter illustrated in FIG. 3 at a 200 MHz clock tuned frequency and with bandwidth control signals code set to (0.0, ±0.5, ±1.0 INV) in accordance with an exemplary embodiment.

With reference to FIG. 19, filter 110 and/or 1110 receives a waveform 2400 at input 130 (FIG. 3). Waveform 2400 is a broadband noise input with a 200 megasample per second clock signal. Filter 110 and/or 1110 outputs waveform 2402 at output 372 and waveform 2404 at output 382. The bandwidth control signal code is 0, ±0.5, ±1 INV. A comparison of waveforms 2402 and 2404 with waveforms 2202 and 2204 (FIG. 18) shows how the filter's pass bandwidth is basically the same while the stop band suppression performance has increased.

Figure 20:
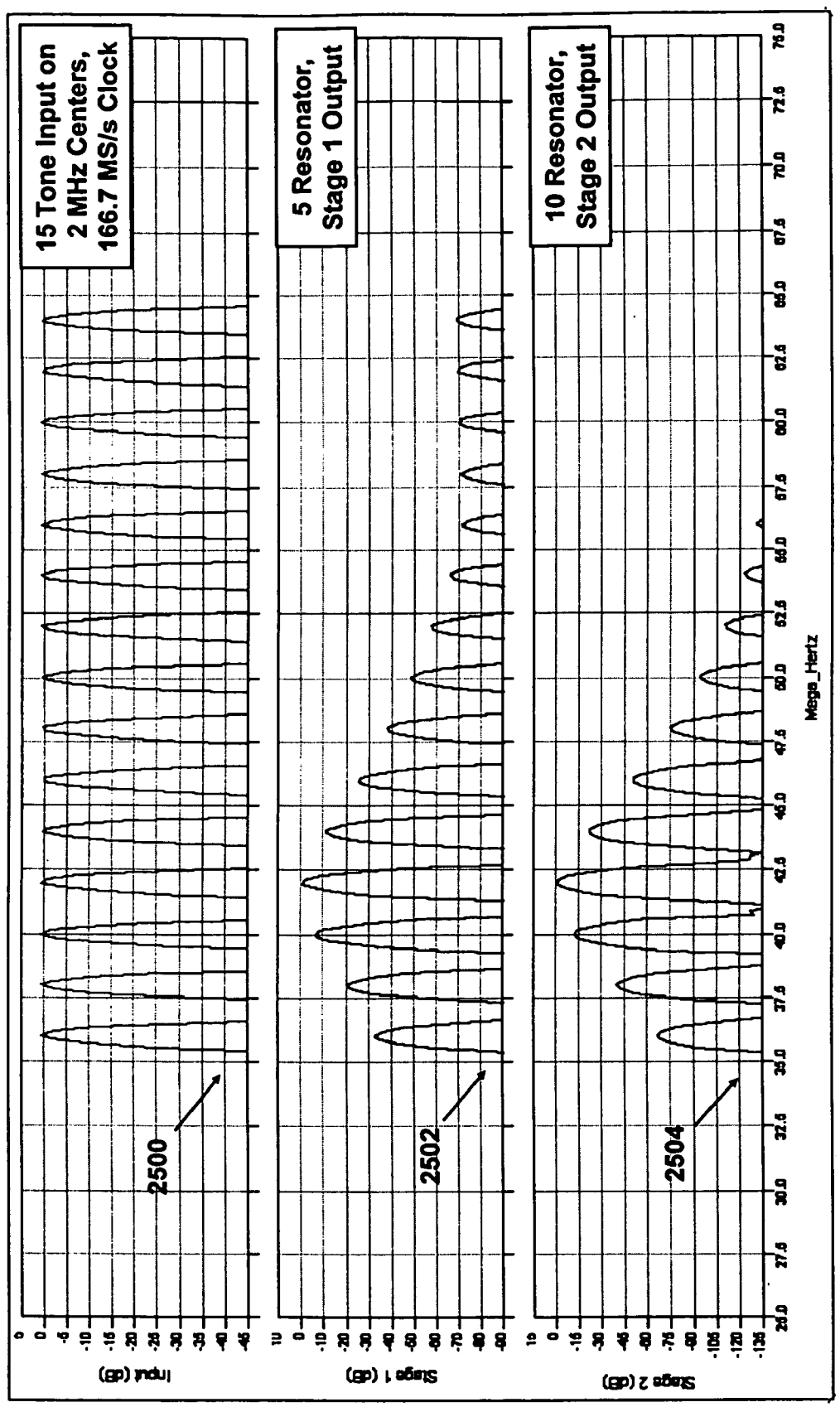
FIG. 20 is a set of waveform diagrams showing the filter response to a 15 tone input signal, for the filter illustrated in FIG. 3 at a 166.7 MHz clock tuned frequency and with bandwidth control signals code set to (0.0, ±0.0, ±0.0) in accordance with an exemplary embodiment.

With reference to FIG. 20, filter 110 and/or 1110 receives a waveform 2500 at input 130 (FIG. 3). Waveform 2500 includes 15 tone input signals on 2 megahertz centers. Waveform 2500 is received with a 166.7 megasample per second clock signal. Filter 110 and/or 1110 outputs waveform 2502 at output 372 and waveform 2504 at output 382. The bandwidth control signal code is 0, ±0.0, ±0.0. A comparison of waveforms 2502 and 2504 with waveforms 1202 and 1204 (FIG. 7) shows how the filter's pass bandwidth center frequency is shifted from 50 megahertz (200/4) to 41.67 megahertz (166.7/4) without changing the filter's Q=center frequency to pass bandwidth ratio.

Figure 21:
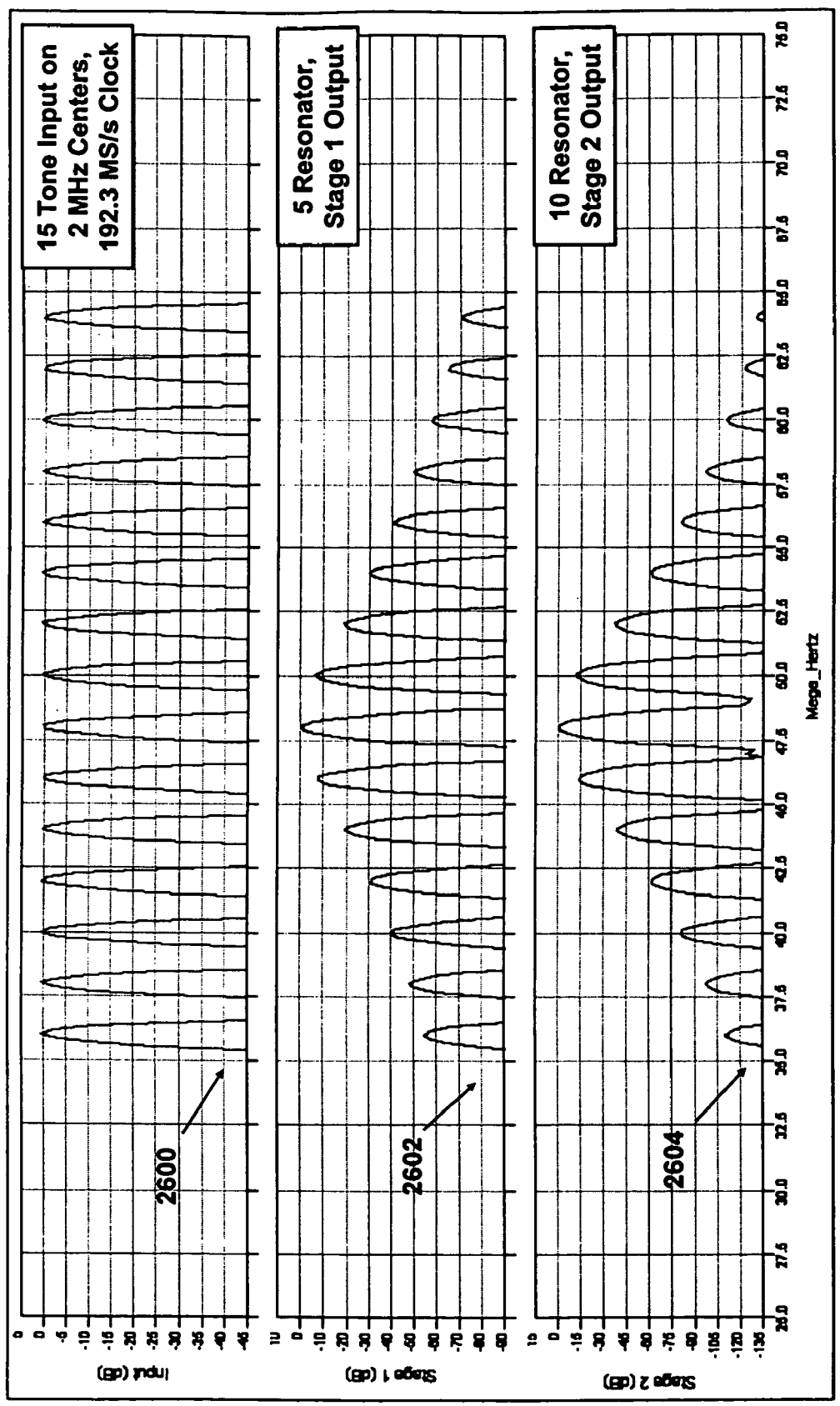
FIG. 21 is a set of waveform diagrams showing the re filter response to a 15 tone input signal, for the filter illustrated in FIG. 3 at a 192.3 MHz clock tuned frequency and with bandwidth control signals code set to (0.0, ±0.0, ±0.0) in accordance with an exemplary embodiment.

With reference to FIG. 21, filter 110 and/or 1110 receives a waveform 2600 at input 130 (FIG. 3). Waveform 2600 includes 15 tone input signals on 2 megahertz centers received with a 192.3 megasample per second clock signal. Filter 110 and/or 1110 outputs waveform 2602 at output 372 and waveform 2604 at output 382. The bandwidth control signal code is 0, ±0.0, ±0.0. A comparison of waveforms 2602 and 2604 with waveforms 1202 and 1204 (FIG. 7) shows how the filter's pass bandwidth center frequency is shifted from 50 megahertz (200/4) to 48.08 megahertz (192.3/4) without changing the filter's Q=center frequency to pass bandwidth ratio.

Figure 22:
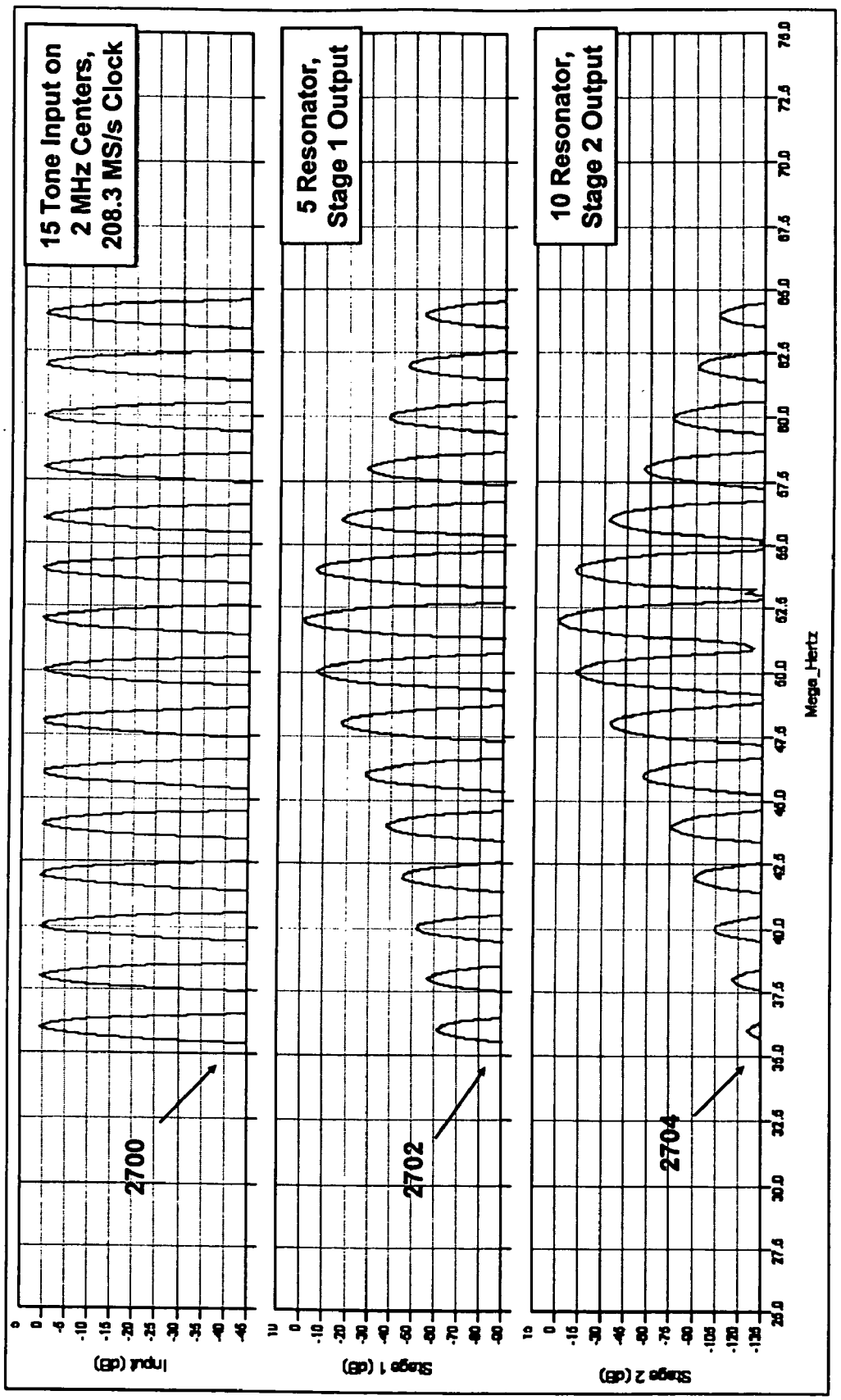
FIG. 22 is a set of waveform diagrams showing the filter response to a 15 tone input signal, for the filter illustrated in FIG. 3 at a 208.3 MHz clock tuned frequency and with the bandwidth control signal code set to (0.0, ±0.0, ±0.0) in accordance with an exemplary embodiment.

With reference to FIG. 22, filter 110 and/or 1110 receives a waveform 2700 at input 130 (FIG. 3). Waveform 2700 includes 15 tone input signals on 2 megahertz centers received with a 208.3 megasample per second clock signal. Filter 110 and/or 1110 outputs waveform 2702 at output 372 and waveform 2704 at output 382. The bandwidth control signal code is 0, ±0.0, ±0.0. A comparison of waveforms 2702 and 2704 with waveforms 1202 and 1204 (FIG. 7) shows how the filter's pass bandwidth center frequency is shifted from 50 megahertz (200/4) to 52.08 megahertz (208.3/4) without changing the filter's Q=center frequency to pass bandwidth ratio.

Figure 23:
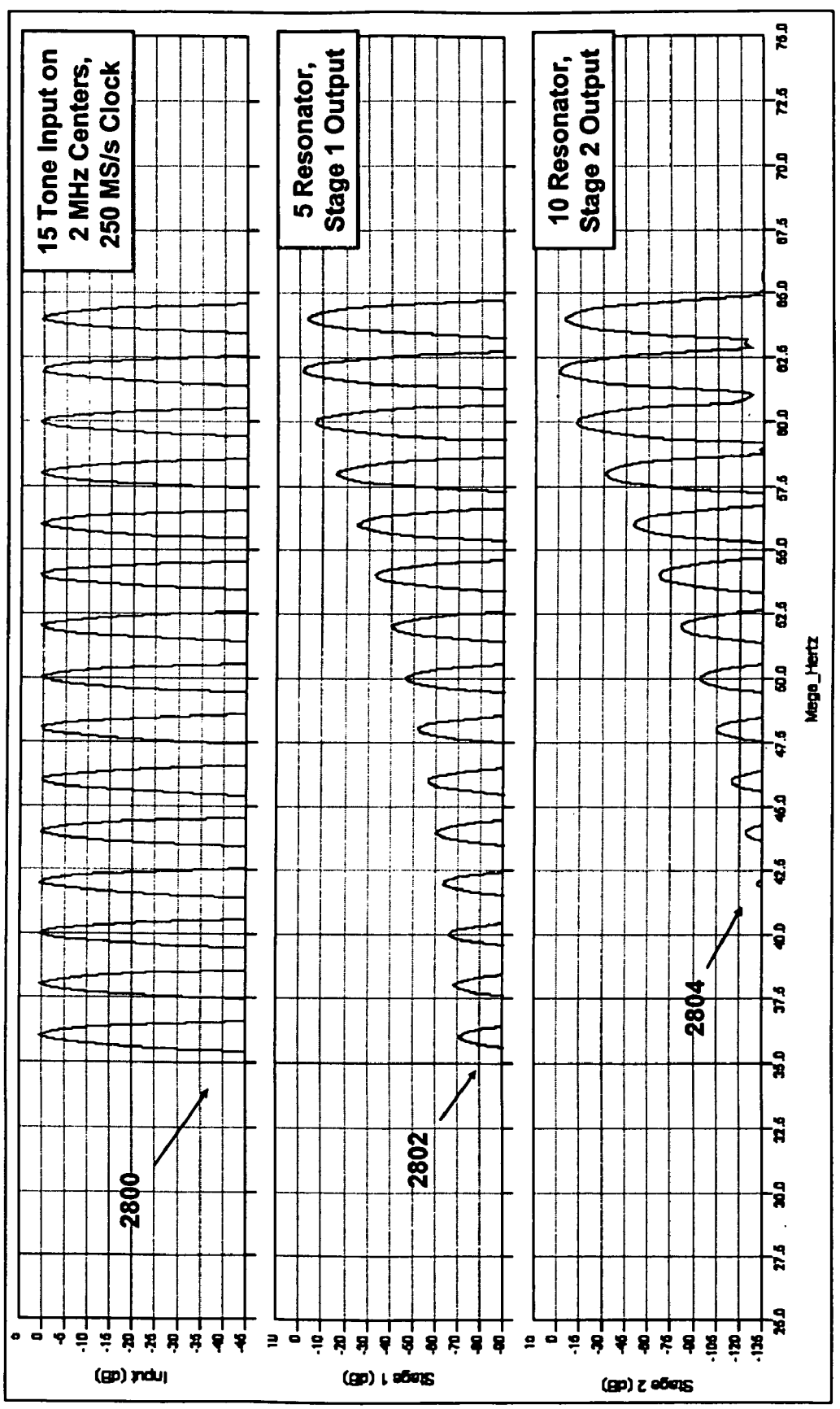
FIG. 23 is a set of waveform diagrams showing the re filter response to a 15 tone input signal, for the filter illustrated in FIG. 3 at a 250 MHz clock tuned frequency and with the bandwidth control signals code set to (0.0, ±0.0, ±0.0) in accordance with an exemplary embodiment.

With reference to FIG. 23, filter 110 and/or 1110 receives a waveform 2800 at input 130 (FIG. 3). Waveform 2800 includes 15 tone input signals on 2 megahertz centers received with a 250 megasample per second clock signal. Filter 110 and/or 1110 outputs waveform 2802 at output 372 and waveform 2804 at output 382. The bandwidth control signal code is 0, ±0.0, ±0.0. A comparison of waveforms 2802 and 2804 with waveforms 1202 and 1204 (FIG. 7) shows how the filter's pass bandwidth center frequency is shifted from 50 megahertz (200/4) to 62.5 megahertz (250/4) without changing the filter's Q=center frequency to pass bandwidth ratio.

Figure 24:
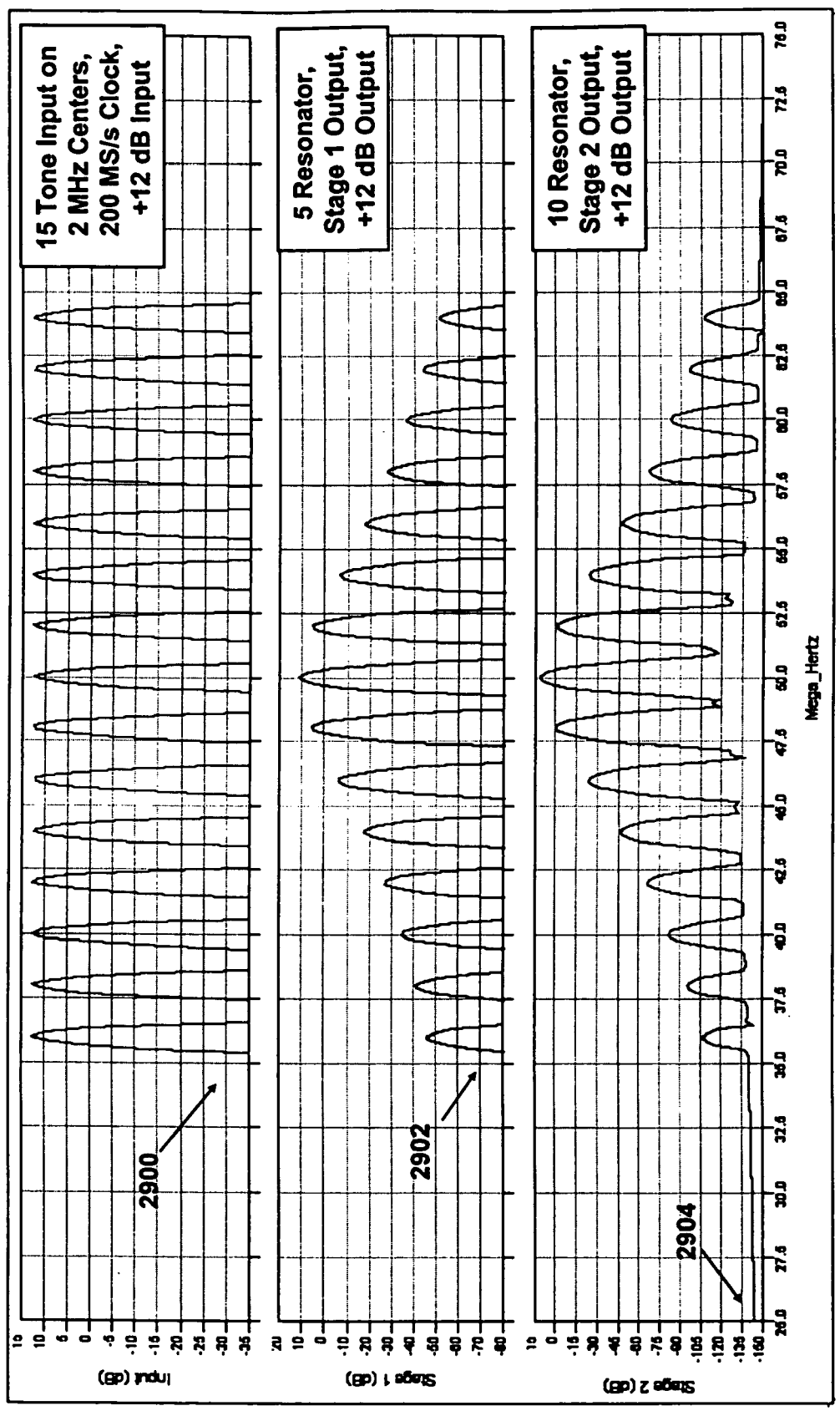
FIG. 24 is a set of waveform diagrams showing the r filter response to a 15 tone input signal, for the filter illustrated in FIG. 3 at a 200 MHz clock tuned frequency and with the bandwidth control signals code set to (0.0, ±0.0, ±0.0 in accordance with an exemplary embodiment.

With reference to FIG. 24, filter 110 and/or 1110 receives a waveform 2900 at input 130 (FIG. 3). Waveform 2900 includes 15 tone input signals on 2 megahertz centers received with a 200 megasample per second clock input, and an increased relative input amplitude of +12 DB. Filter 110 and/or 1110 outputs waveform 2902 at output 372 and waveform 2904 at output 382. The bandwidth control signal code is 0, ±0.0, ±0.0. A comparison of waveforms 2902 and 2904 with waveforms 1202 and 1204 (FIG. 7) shows a relative increase in output amplitude of +12 dB, which shows the amplitude linearity of the filter.

Figure 25:
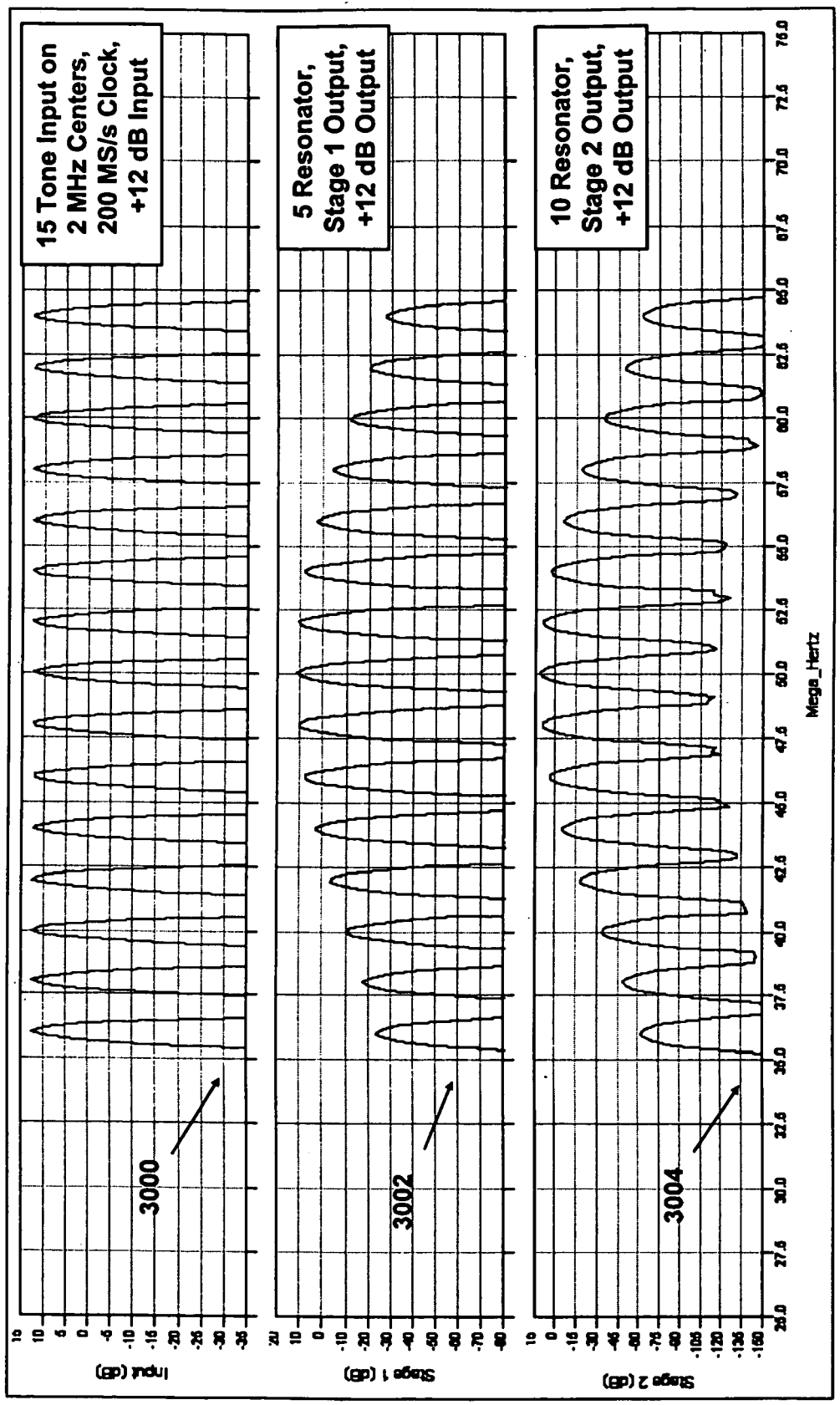
FIG. 25 is a set of waveform diagrams showing the filter response to a 15 tone input signal, for the filter illustrated in FIG. 3 at a 200 MHz clock tuned frequency and with bandwidth control signals code set to (0, ±0.25, ±0.5) in accordance with an exemplary embodiment.

With reference to FIG. 25, filter 110 and/or 1110 receives a waveform 3000 at input 130 (FIG. 3). Waveform 3000 includes 15 tone input signals on 2 megahertz centers received with a 200 megasample per second clock signal input, and an increased relative input amplitude of +12 DB. Filter 110 and/or 1110 outputs waveform 3002 at output 372 and waveform 3004 at output 382. The bandwidth control signal code is 0, ±0.25, ±0.5. A comparison of waveforms 3002 and 3004 with waveforms 1702 and 1704 (FIG. 12) shows a relative increase in output amplitude of +12 dB, which again shows the amplitude linearity of the filter.

In FIGS. 7-25, the x axis represents frequency in megahertz and the y axis represents decibels. The performance shown in FIGS. 7-25 is shown in exemplary fashion only.

The present invention is not limited to the waveforms and components shown. It is understood that, while the exemplary embodiments have been described, they are for the purpose of illustration only. The present invention should not be limited to the details disclosed. Various modifications will be apparent to those skilled in the art and this application is intended to include all such modifications and variations within the scope of the appended claims.

What is claimed is:

1. An apparatus, comprising:
   a sample clock input;
   a bandwidth control input; and
   at least one sampled signal resonator based filter stage comprising at least one sampled signal resonator unit, the sampled signal resonator unit being coupled to the sample clock input and the bandwidth control input, the sampled signal resonator unit including at least one reversible (loss/gain) attenuator coupled to the bandwidth control input and at least one clock delay circuit coupled to the sample clock input, whereby the stage serves to provide at least part of a programmable bandwidth, bandpass gain response filter.

2. An apparatus as claimed in claim 1, wherein the at least one of said sampled signal resonator unit comprise an input summer for receiving an input signal, a tuning element for providing a tuning signal to said input summer, a first delay element coupled from an output of said input summer to said tuning element whereby a first delay loop is provided, and a second delay element coupled from the first delay element output to an input of said input summer whereby a second delay loop is provided.

3. An apparatus as claimed in claim 2, wherein a total signal delay of said second delay loop is equal to twice a total signal delay of said first delay loop such that performance of the apparatus is optimized.

4. An apparatus as claimed in claim 1, further comprising a low pass or band pass filter coupled to a frequency response control input and providing antialias protection for the sampled signal resonator based filter stage.

5. An apparatus as claimed in claim 1, further comprising an analog-to-digital converter coupled to the sampled signal resonator based filter stage and the sample clock input.

6. An apparatus as claimed in claim 1, wherein the sampled signal resonator based filter stage includes at least one bandpass sampled signal resonator.

7. An apparatus as claimed in claim 6, wherein the sampled signal resonator based filter stage includes at least one band-reject sampled signal resonator.

8. An apparatus as claimed in claim 1, wherein said sampled signal resonator based filter stage includes "N" sampled signal resonator units, where "N" is greater than one.

9. An apparatus as claimed in claim 1, further comprising a digital-to-analog converter coupled to the sampled signal resonator based filter stage and the sample clock input.

* * * * *